United States Patent [19]
Takagi et al.

[11] Patent Number: 5,726,611
[45] Date of Patent: Mar. 10, 1998

[54] EMC FILTER FOR A BALANCED MULTI-WIRED TELECOMMUNICATION LINE WITH BIFILAR WINDINGS

[75] Inventors: Kusuo Takagi; Ryoichi Okayasu, both of Tokyo, Japan

[73] Assignee: Nippon Telegraph and Telephone Corporation, Tokyo, Japan

[21] Appl. No.: 749,623

[22] Filed: Nov. 18, 1996

Related U.S. Application Data

[63] Continuation of Ser. No. 249,025, May 25, 1994, abandoned.

[30] Foreign Application Priority Data

| May 31, 1993 | [JP] | Japan | 5-149723 |
| May 26, 1993 | [JP] | Japan | 5-145482 |
| May 26, 1993 | [JP] | Japan | 5-145483 |

[51] Int. Cl.$^6$ .................................... H03H 7/09
[52] U.S. Cl. .................... 333/181; 333/185; 336/184; 336/224; 379/416
[58] Field of Search .................. 333/181, 182, 333/183, 184, 185; 336/171, 173, 180, 184, 215, 224, 233; 379/414, 415, 416, 417

[56] References Cited

U.S. PATENT DOCUMENTS

| 4,751,607 | 6/1988 | Smith | 379/416 X |
| 4,835,497 | 5/1989 | Takagi et al. | 333/181 X |
| 4,910,482 | 3/1990 | Takagai et al. | 333/181 |
| 5,287,008 | 2/1994 | Pahr | 333/12 X |
| 5,346,410 | 9/1994 | Moore, Jr. | 333/181 X |

FOREIGN PATENT DOCUMENTS

| 61-256708 | 11/1986 | Japan . |
| 61-263105 | 11/1986 | Japan . |
| 63-38220 | 2/1988 | Japan . |
| 2-132806 | 5/1990 | Japan . |
| 2-70419 | 5/1990 | Japan . |
| 3-20057 | 3/1991 | Japan . |
| 3-241718 | 10/1991 | Japan . |
| 4-288806 | 10/1992 | Japan . |

OTHER PUBLICATIONS

Matsch, *Electromagnetic and Electromechanical Machines*, 2nd ed., Harper & Row Publishers, p. 100, 1977.
IBM Technical Disclosure Bulletin, vol. 19, No. 5, Oct. 1976, Ovies et al., "Electrical Noise Attenuator" p. 1534.

*Primary Examiner*—Robert Pascal
*Assistant Examiner*—Justin P. Bettendorf
*Attorney, Agent, or Firm*—Nikaido, Marmelstein, Murray & Oram LLP

[57] ABSTRACT

An EMC filter for a balanced multi-wired telecommunication line has an oblong closed magnetic path core 50 having at least one first core arm 50a with a first length and second core arms 50b with a second length which is equal to or shorter than the first length, and a plurality of coils 51 constituted by at least one pair of wires. The at least one first core arm 50a and the second core arms 50b constitute a closed magnetic path. The wires of each pair are closely positioned each other and wound around the at least one first core arm 50a so as to produce magnetic fluxes in the first core arm 50a flowing toward the same direction when a common-mode current flows through the wires. Each of the coils 51 has a signal input end and a signal output end, and the wires run in a one-way direction from the signal input ends to the signal output ends, respectively.

12 Claims, 38 Drawing Sheets

MODULAR PLUG

MODULAR JACK

EMC FILTER FOR A BALANCED MULTI-WIRED TELECOMMUNICATION LINE WITH BIFILAR WINDINGS

This application is a continuation of application Ser. No. 08/249,025 filed May 25, 1994 now abandoned.

BACKGROUND OF THE INVENTION

1. Field of the Invention

The present invention relates to an EMC (electromagnetic compatibility) filter for suppressing common-mode noise currents flowing through a balanced multi-wired telecommunication line over a wide frequency range.

2. Description of the Related Art

Recently, as ISDN communication systems have become more widespread, many electromagnetic noise problems of communication equipment such as malfunctions or performance degradation have occurred due to external electromagnetic disturbances introduced into the equipment through a balanced multi-wired telecommunication line such as a standard home bus, a high speed digital bus, an interface cable, and an extension bus.

In order to reduce these electromagnetic noise problems, particularly of communication equipment such as telephones or facsimile machines which will in many cases, be used without being electrically grounded, an appropriate noise suppressing (EMC) filter having the following characteristics will become necessary.

(1) an effective suppressing characteristic against various high frequency disturbance currents (common-mode noise currents) in a non-grounded state, (2) a small transmission loss against information signals (differential-mode or normal-mode currents), and (3) a small crosstalk between pair wires in a multi-wired telecommunication line.

As conventional EMC filters for preventing common-mode noise currents which will flow in the same direction through wires of a balanced multi-wired telecommunication line such as a balanced multi-pairs cable or a flat cable, choke coils with a toroidal core or a passing through core have been used.

In FIGS. 1a and 1b, which show an oblique view and a sectional view of a schematic structure of a conventional choke coil filter using a toroidal core, reference character 10 denotes the ring toroidal core, 11 denotes n-coils wound around the toroidal core 10 in the same winding direction and connected to n-wires of a telecommunication line (not shown), $T_1, T_2, T_3, \ldots, T_n$ denote input terminals of the coils, and $T_1', T_2', T_3', \ldots, T_n'$ denote output terminals of the coils. It is known in the art that the performance for preventing the common-mode noise current of such the choke coil is determined by a self-inductance L of the coil, and that the inductance L is proportional to a square of the number of turns N of the coil 11 wound around the core 10. Therefore, in general, the number of turns N will be selected to be as large a number as much as possible.

However, as shown in FIG. 1b, since many coiled wires pass through the inner circular opening of the ring toroidal core 10 and thus they are close together, a stray capacitance Cs will be produced between the input terminal and the output terminal of each of the wound wires.

FIGS. 2a and 2b show circuit diagrams of electrical equivalent circuits of the toroidal choke coil shown in FIGS. 1a and 1b. In FIG. 2a, reference character Cs denotes stray capacitances between the input and output terminals $T_1-T_1'$, $T_2-T_2'$, $T_3-T_3'$, $\ldots$, $T_n-T_n'$, LC denote inductances for common-mode currents Ic (common-mode inductances), and Re denote effective resistances of the coils. In FIG. 2b, reference character Cs denotes stray capacitances between the input and output terminals $T_1-T_1'$, $T_2-T_2'$, $T_3-T_3'$, $\ldots$, $T_n-T_n'$, Ld denote leakage inductances for normal-mode currents In, and Rw denote coil resistances. It should be noted that mutual inductances between the neighbor coils are not illustrated in these figures. If a mutual inductance between coiled pair wires for transmitting signals in a multi-wired telecommunication line is expressed as M, the above-mentioned common-mode inductance Lc and leakage inductance Ld will expressed as Lc=L+M and Ld=L−M, respectively.

When high frequency common-mode currents Ic which flow in the wires in the same phase are introduced into the input terminals $T_1, T_2, T_3, \ldots, T_n$ of the choke coil filter shown in FIGS. 1a and 1b, a high frequency component of these common-mode currents Ic will pass through the stray capacitance Cs portions to the output terminals $T_1', T_2', T_3', \ldots, T_n'$ without flowing through the coiled wires. Thus, the choke coil filter using such the ring type toroidal core 10 will exhibit poor noise suppression against high frequency common-mode noise currents Ic even if the inductances Lc of the coils are large enough.

If going and returning signal currents In (normal-mode currents) flowing through pair wires in the multi-wired telecommunication line include high frequency components, high frequency range insertion loss of pair coiled wires of the choke coil filter, such as a pair of the coiled wires between the input and output terminals $T_1-T_1'$ and $T_2-T_2'$ shown in FIG. 2b, may greatly increase due to the aforementioned leakage inductances Ld. This increase of the insertion loss may disturb signal transmission and thus disable circuits connected to these pair wires.

FIG. 3 shows an oblique view of a schematic structure of a conventional choke coil filter with a plane passing through core 30 surrounding flat arranged wires 31 of a balanced multi-wired telecommunication line such as a flat cable. The choke coil filter with such the structure will provide smaller stray capacitance between the wires and between its input and output terminals than that provided by the filter shown in FIGS. 1a and 1b. However, since the wires 31 of the telecommunication line are fed through the plane loop core 30 only one time, namely wound by one turn, inductance L produced by magnetic fluxes $\phi_1, \phi_2, \phi_3, \ldots, \phi_n$ flowing in the core 30 due to the common-mode noise currents Ic will be small within the low frequency range. Therefore, it is necessary that the plane loop core 30 has an extremely large sectional area of an extremely long axial length 1 in order to effectively suppress the common-mode noise currents Ic. If the axial length 1 of the core 30 is short, the wires 31 have to pass through a large number of the plane loop cores 30.

FIG. 4 shows an oblique view of a schematic structure of a conventional choke coil filter with a cylindrical passing through core 40 surrounding wires 41, with a circular section, of a balanced multi-wired telecommunication line such as a balanced multi-pairs cable. Problems of the choke coil filter with such a structure are the same as that of the filter shown in FIG. 3.

As will be understood from the above-description, the conventional choke coil filter with the ring type toroidal core 10 shown in FIGS. 1a and 1b has a poor noise suppression capability against high frequency common-mode noise currents due to the stray capacitances Cs, and causes an increase of the high frequency range insertion loss due to the leakage inductances Ld of the coiled wires resulting disturbance of signal transmission. Also, the conventional choke coil filter with the flat passing through core 30 shown in FIG. 3 and the conventional choke coil filter with the cylindrical passing through core 40 shown in FIG. 4 have insufficient noise suppression capability against the common-mode noise currents Ic within the low frequency range. Therefore, in order to prevent the common-mode noise currents Ic, the sectional area of the core has to be extremely large, the axial length 1 of the core has to be extremely long, or a large number of the cores have to be connected together if an axial length 1 of each core is short.

SUMMARY OF THE INVENTION

It is therefore an object of the present invention to provide an EMC filter for a balanced multi-wired telecommunication line, with an excellent noise suppression capability against common-mode noise currents flowing through the balanced multi-wired telecommunication line over a wide frequency range.

Another object of the present invention is to provide an EMC filter for a balanced multi-wired telecommunication line, with a small transmission loss against information signals flowing through the balanced multi-wired telecommunication line, and therefore capable of being used for a high speed transmission line.

Yet another object of the present invention is to provide an EMC filter for a balanced multi-wired telecommunication line, with a small crosstalk between pair wires in the balanced multi-wired telecommunication line.

According to the present invention, an EMC filter for a balanced multi-wired telecommunication line has an oblong closed magnetic path core having at least one first core arm with a first length and second core arms with a second length which is equal to or shorter than the first length, and a plurality of coils constituted by at least one pair of wires. The at least one first core arm and the second core arms constitute a closed magnetic path. The wires of each pair are closely positioned with respect to each other and are wound around the at least one first core arm so as to produce magnetic fluxes in the first core arm flowing toward the same direction when a common-mode current flows through the wires. Each of the coils has a signal input end and a signal output end, and the wires run in a one-way direction from the signal input ends to the signal output ends, respectively.

When common-mode noise currents flow through the coiled wires, since magnetic fluxes produced by the respective coils are summed with each other in the closed magnetic path core, very large inductance is obtained and thus the noise currents are prevented from being introduced. When signal currents (differential-mode or normal-mode currents) flow through the coiled wires, since magnetic fluxes produced by the respective wires compensate each other in the closed magnetic path core, the leakage inductance becomes very small and thus signal transmission will not prevented.

According to the present invention, in particular, since the wires of each pair for transmitting signals are closely positioned with respect to each other and wound around the same closed magnetic path core, no leakage magnetic flux will be produced. Thus, a low transmission loss for high speed or high frequency signal transmission can be attained resulting in signal transmission in a high frequency range being realized.

Preferably, each pair of the wires is constituted by a parallel pair of wires contacted with each other.

It is preferable that each pair of the wires is constituted by a twisted pair. By using the twisted pair wires, since there occurs no unbalance between the wires of each pair, a small crosstalk between pairs of wires in the balanced multi-wired telecommunication line can be attained.

Preferably, the first core arm consists of a first section and a second section, and each pair of the wound wires is distributed with a space between its neighbor windings in the first section of the first core arm. By distributing each pair of the wound wires on the core with a space between the neighbor windings, stray capacitances Cs between the windings of the wound wire pair can be reduced and thus good suppression capability against he common-mode noise currents can be obtained even in a high frequency range.

Preferably, each pair of the wound wires is concentrated with no space between the neighbor windings in the second section of the first core arm. By concentrating each pair of the wound wires on the core, self-inductance in a low frequency range can be increased and good suppression capability against the common-mode noise currents can therefore be obtained even in the low frequency range. As a result, an excellent noise suppression capability for the balanced multi-wired telecommunication line over a wide frequency range can be attained.

The EMC filter can be configured such that the signal input ends are positioned at one end of the first core arm and the signal output ends are positioned at the other end of the first core arm, so that each of the wires is started from the signal input end, wound around the first core arm along its axis, and ends at the signal output end.

The EMC filter can be also configured such that the first core arm consists of at least input side and output side first core arms, and that the signal input ends are positioned along the input side first core arm and the signal output ends are positioned along the output side first core arm. Each of the wires is started from the signal input end, wound around the input side first core arm toward a first axial direction, introduced to the output side first core arm, wound around the output side first core arm toward a second axial direction opposite to the first axial direction, and ends at the signal output end.

The EMC filter can be further configured such that the first core arm consists of at least input side and output side first core arms, and that the signal input ends are positioned at a center of the input side first core arm and the signal output ends are positioned at a center of the output side first core arm. Each of the wires is started from the signal input end, wound around the input side first core arm toward one end of the input side first core arm, introduced to the output side first core arm, wound around the output side first core arm toward the center of the output side first core arm, and ends at the signal output end.

The second section may be positioned near a center of the first core arm and the first section may be positioned at both sides of the second section, or the first section may be positioned near a center of the first core arm and the second section may be positioned at both sides of the first section.

The closed magnetic path core may be constituted by two parallel first core arms and two parallel second core arms connected to each other to form a rectangular loop core.

In a modification, the filter further has an additional closed magnetic path core laid across the second sections of the two first core arms, and the pair wires are wound around the additional closed magnetic path core in common with the second sections of the first core arms.

The closed magnetic path core may be constituted by two first core arms and two second core arms connected each other to form a rhombus-like loop core, or a oval loop core.

The closed magnetic path core may consist of a center core arm, side core arms in parallel with the center core arm, and second core arms connected to both ends of the center core arm and the side core arms. In this case, the first core arm may be constituted by the center core arm.

Each pair of the wound wires may be distributed with a space between its neighbor windings in the first core arm, and each pair of the wound wires may be concentrated with no space between its neighbor windings in the second core arm. In this case, the filter may further have two additional closed magnetic path cores arranged at the second core arms, respectively, and the pair wires are wound around the additional closed magnetic path cores in common with the second core arms.

Further objects and advantages of the present invention will be apparent from the following description of the preferred embodiments of the invention as illustrated in the accompanying drawings.

DETAILED DESCRIPTION OF THE PREFERRED EMBODIMENTS

Figure 5:
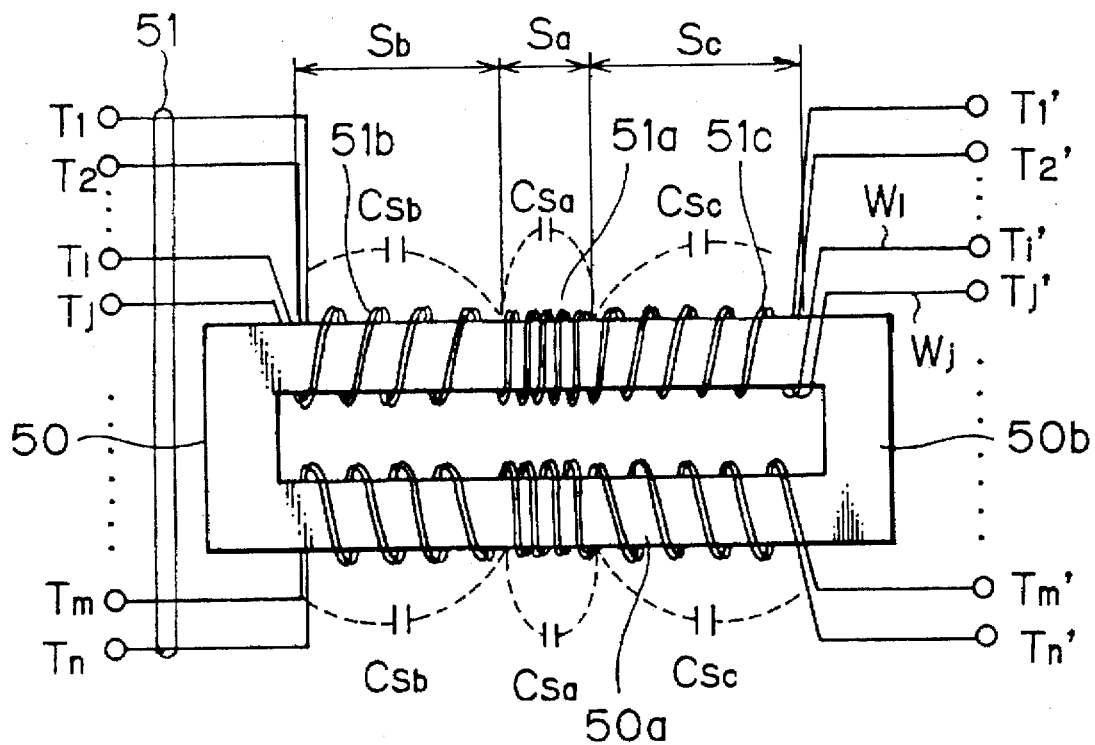
FIG. 5 shows a plane view of a preferred first embodiment of an EMC filter according to the present invention.
Figure 6:
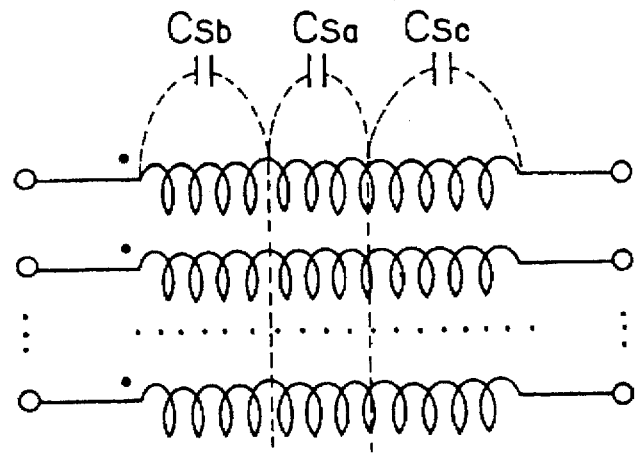
FIG. 6 shows a circuit diagram of an electrical equivalent circuit of the EMC filter shown in FIG. 5.

FIG. 5 shows a plane view of a schematic structure of a preferred first embodiment of an EMC filter according to the present invention, and FIG. 6 shows a circuit diagram of an electrical equivalent circuit (effective resistances of the coils are omitted from the illustration) of the EMC filter shown in FIG. 5.

In FIG. 5, reference numeral 50 denotes an oblong closed magnetic path core formed by two parallel first core arms 50a and two parallel second core arms 50b. The first core arms 50a and the second core arms 50b are connected to each other to form a (symmetrical) rectangular loop core. The first core arms 50a are longer than the second core arms 50b, and these first and second core arms 50a and 50b constitute a closed magnetic path. The rectangular loop core 50 has an effective magnetic permeability $\mu$ which is substantially equal to that of the conventional toroidal core 10 shown in FIGS. 1a and 1b.

Around the first core arms 50a, one or more pairs of wires 51 are wound to form a plurality of coils which will be connected to respective wires of a balanced multi-wired telecommunication line (not shown). In FIG. 5 and also in the following figures, only typical pair or pairs of coiled wires are illustrated to simplify an understanding of the winding structure. A pair of wires are, in FIG. 5, illustrated by $W_i$ and $W_j$ as examples. These wires 51 are wound on the first core arms 50a in turning directions so as to produce magnetic fluxes in the closed core 50 flowing toward the same direction when a common-mode current flows through the wires. A half of the pairs of wires are wound on one of the first core arms 50a and the remaining half are wound on the other one of the first core arms 50a. The coils have signal input ends (input terminals) $T_1, T_2, \ldots, T_i, T_j \ldots T_m, T_n$ at one ends of the first core arms 50a and signal output ends (output terminals) $T_1', T_2', \ldots, T_i', T_j', \ldots T_m', T_n'$ at the other ends of the first core arms 50a. The wires run in a one-way direction from the signal input ends $T_1, T_2, \ldots, T_i, T_j, \ldots T_m, T_n$ at one ends of the first core arms 50a to the signal output ends $T_1', T_2', \ldots, T_i', T_j', \ldots T_m', T_n'$ at the other ends of the first core arms 50a, respectively. Each pair of the wires is therefore started from the signal input end, wound along an axis of the first core arm 50a toward its axial direction, and arrived at the signal output end.

The wires of each pair are closely positioned with respect to each other. Namely, in this embodiment, the wires of each pair are constituted by parallel pair wires contacted with each other.

Along its axis, each of the first core arms 50a is separated into three sections, namely two first sections Sb and Sc and one second section Sa, as shown in FIG. 5. in the first sections Sb and Sc positioned at both sides of the second section Sa, each pair of the wound wires 51b and 51c is distributed with a space between its neighbor windings. In the second section Sa positioned near a center of the first core arm 50a, each pair of the wound wires 51a is concentrated with no space between its neighbor windings. Stray capacitances between input and output ends of the wound wire in these sections Sa, Sb and Sc are illustrated by $Cs_a$, $Cs_b$ and $Cs_c$, respectively, in FIG. 5.

Although the second section Sa is positioned near a center of the first core arm 50a in the aforementioned first embodiment, this second section Sa may be formed at any position of the first core arm 50a other than near its center, according to the present invention.

Since the length of the distributed winding section Sb and Sc are sufficiently longer than that of the concentrated winding sections Sa, although the stray capacitance $Cs_a$ is large in comparison with the stray capacitances $Cs_b$ and $Cs_c$, the total capacitances Cs determined by adding on these $Cs_a$, $Cs_b$ and $Cs_c$ in series will be suppressed from increasing as a whole by an action of small $Cs_b$ and $Cs_c$.

Figure 7:
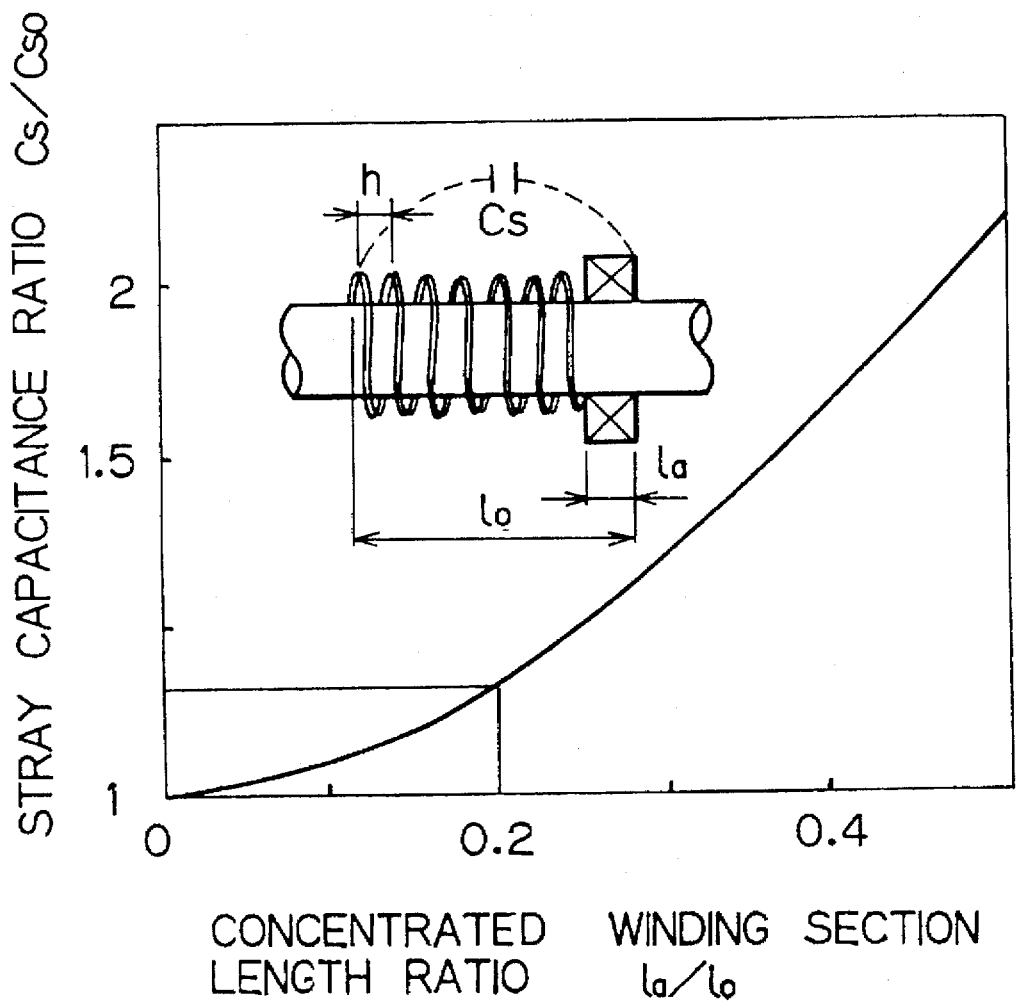
FIG. 7 shows a relationship between a ratio $l_d/l_0$ and a stray capacitance ratio $Cs/Cs_0$.

FIG. 7 shows a relationship between a ratio $l_a/l_0$ of an axial half length $l_a$ of the concentrated winding section Sa to an axial half length $l_0$ of the all winding sections and a ratio $Cs/Cs_0$ of a stray capacitance Cs to $Cs_0$ which is a stray capacitance when $l_0=l_a$. A space between the neighbor windings of a pair of wires (coil pitch) h in the distributed winding section Sb (Sc) is kept at a constant, for example h=0.5 mm. As will be apparent from the figure, the shorter of the length $l_a$, the smaller of the ratio $Cs/Cs_0$. For example, if $l_a/l_0$ is equal to or less than 0.2, $Cs/Cs_0$ can be suppressed to be equal to or less than 1.2.

Figure 8:
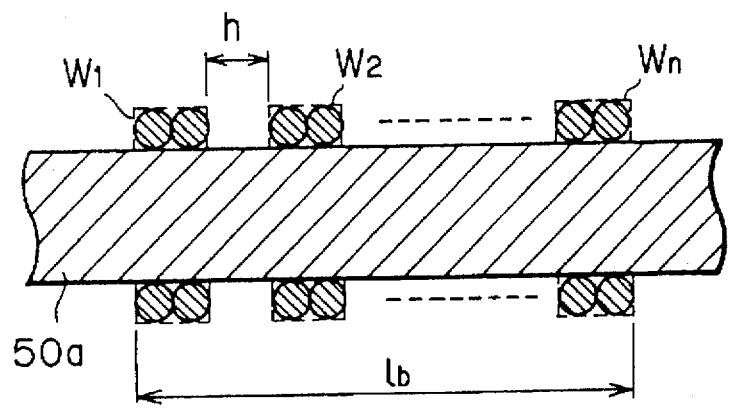
FIGS. 8a to 8c show sectional views for illustrating winding structures of a pair of wires wound around the core in the distributed winding sections Sb and Sc shown in FIG. 5.
Figure 8:
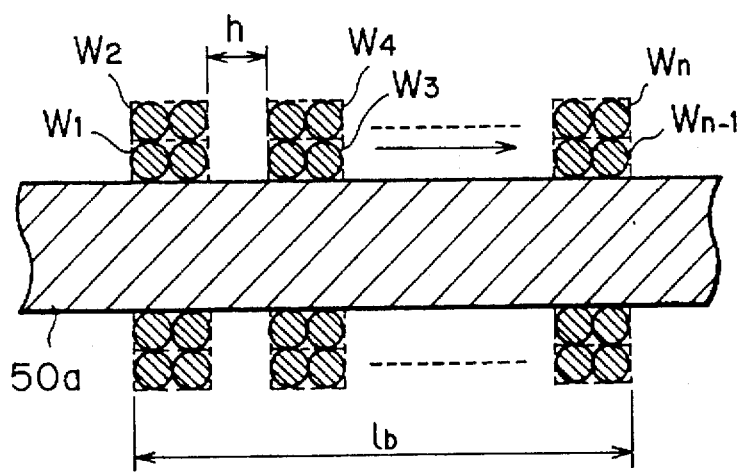
Figure 8:
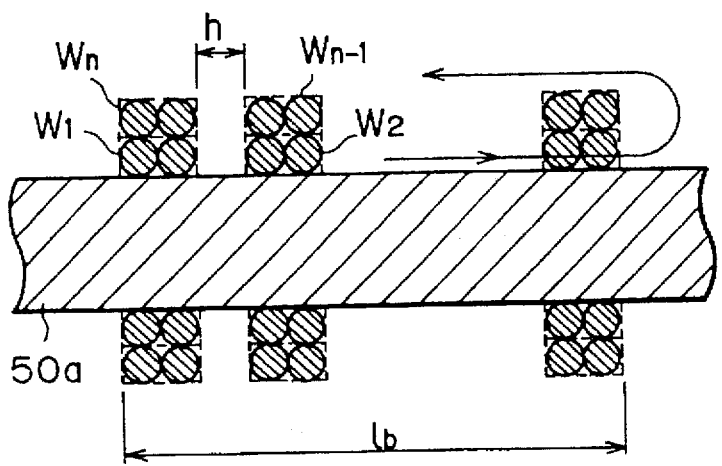

FIGS. 8a to 8c show sectional views for illustrating winding structures of a pair of wires wound around the core in the distributed winding section Sb(Sc) shown in FIG. 5.

As shown in these figures, the wires of each pair are closely positioned in parallel and contacted with each other.

In the structure of FIG. 8a, the contacted wires pair is wound around the core 50a in a single layer so that the wound pair runs in a one-way direction along the core 50a (one-way winding) in a sequential order as $W_1, W_2, \ldots, W_n$ with a space h between the neighbor windings by inserting a part such as a spacer (not shown). This single layer one-way winding structure can suppress an increase of the stray capacitances $Cs_b$ and $Cs_c$ and also can decrease the leakage inductances between the coiled pairs.

In the structure of FIG. 8b, the contacted wires pair is wound around the core 50a in double layers so that the wound pair runs in a one-way direction along the core 50a (one-way winding). Namely, the contacted wires pair is at first wound by two turns around the core 50a in double layers as shown by $W_1$ and $W_2$, then wound by two turns $W_3$ and $W_4$ with putting a space h between the two turns windings by inserting a spacer (not shown). Similar one-way winding in double layers will be sequentially executed until the last wound pair $W_{n-1}$ and $W_n$ in this distributed winding section. This double layer one-way winding structure can suppress an increase of the stray capacitances $Cs_b$ and $Cs_c$ in some degree and also can decrease the leakage inductances between the coiled pairs.

In the structure of FIG. 8c, the contacted wires pair is wound around the core 50a in double layers so that the wound pair runs forward and backward along the core 50a (return winding). Namely, the wound pair in a lower layer runs in a direction along the core 50a in a sequential order as $W_1, W_2, \ldots$ with a space h between the neighbor windings by inserting such as a spacer not shown, but the wound pair in an upper layer runs in the opposite direction as shown by $\ldots, W_{n-1}, W_n$. This double layers return winding structure however cannot effectively prevent the increase of the stray capacitances $Cs_b$ and $Cs_c$.

Figure 9:
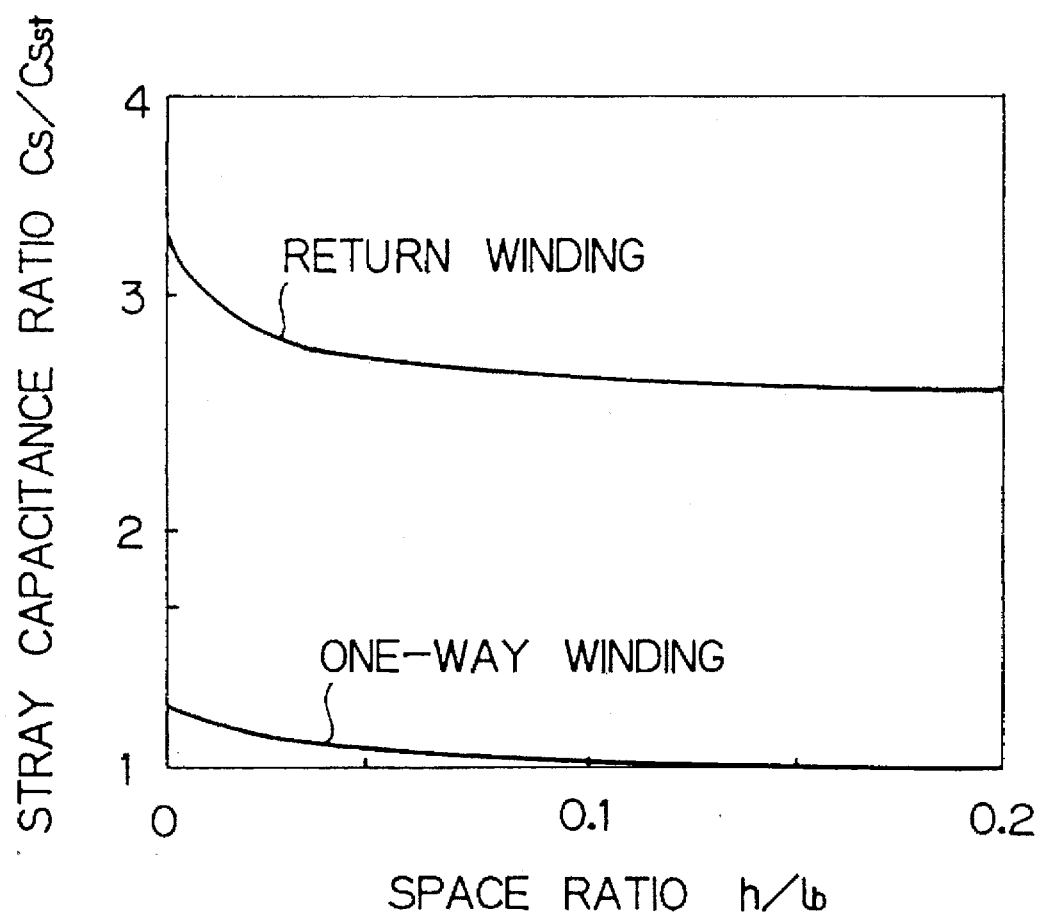
FIG. 9 shows a relationship between a space ratio $h/l_b$ and a stray capacitance ratio $Cs/Cs_{sr}$.

FIG. 9 shows a relationship between a ratio $h/l_b$ of a space between the neighbor wound pairs h to an axial length $l_b$ of the distributed winding section Sb and a ratio $Cs/Cs_{st}$ of a stray capacitance Cs of the coiled wire between its input and output ends to $Cs_{st}$ which is a standard stray capacitance when $h/l_b=0.2$, with respect to the one-way winding structure of FIG. 8b and to the return winding structure of FIG. 8c. As will be apparent from the figure, the one-way winding structure has better suppression capability against the increase of the stray capacitance Cs than that of the return winding structure, and also this suppression capability of the one-way winding structure has a very small dependency upon the coil pitch h.

Therefore, by using the one-way winding structure, the stray capacitance Cs may be effectively prevented or suppressed from increasing without spacing the windings of each pair of the wires.

Figure 10:
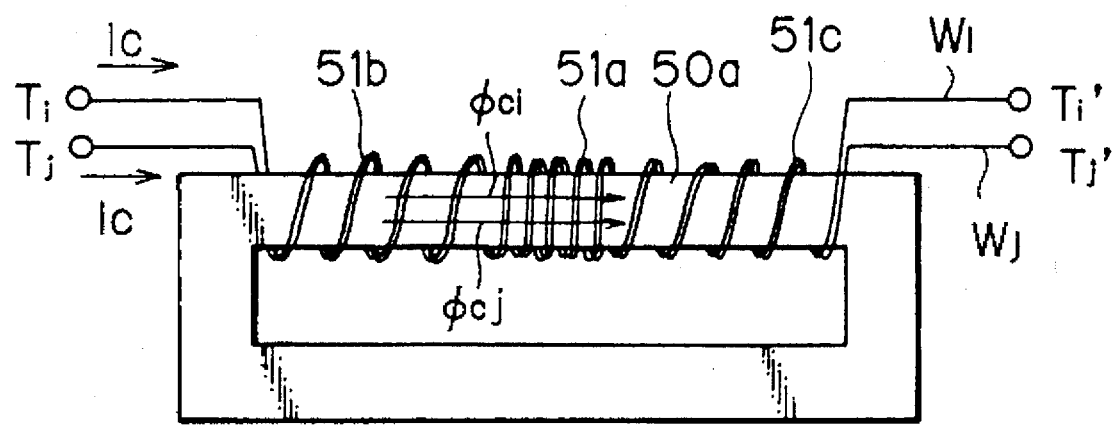
FIGS. 10a and 10b show plane views for illustrating operations of the EMC filter of the embodiment shown in FIG. 5 against common-mode noise currents Ic and signal currents In flowing through the pair wound wires $W_i$ and $W_j$, respectively.
Figure 10:
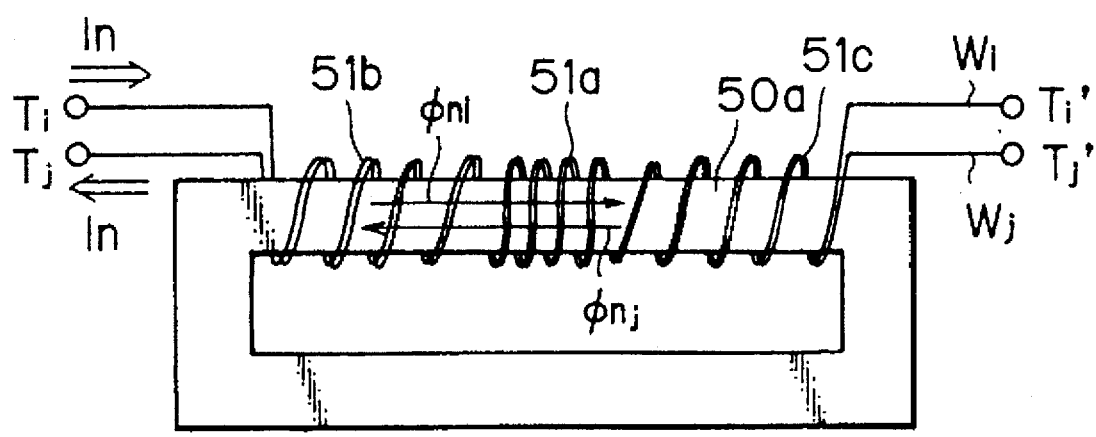

FIGS. 10a and 10b show plane views for illustrating operations of the EMC filter of the embodiment shown in FIG. 5 against common-mode noise currents Ic and signal currents (normal-mode currents) In flowing through the pair of wound wires $W_i$ and $W_j$, respectively.

When common-mode noise currents Ic flow through the pair wound wires $W_i$ and $W_j$, magnetic fluxes $\phi_{ci}$ and $\phi_{cj}$ flow in the first core arm 50a as shown in FIG. 10a. Since these magnetic fluxes $\phi_{ci}$ and $\phi_{cj}$ flow through the closed loop core 50 in the same direction, a total magnetic flux is increased. In fact, as magnetic fluxes due to another coils (not shown) in FIG. 10a are added, a total inductance L will be increased to a very large value. As will be apparent from the equivalent circuit of FIG. 6, an input/output coil stray capacitances Cs is determined by the stray capacitances $Cs_a$, $Cs_b$ and $Cs_c$. Therefore, if the length of each the distributed winding sections Sb and Sc is sufficiently longer than that of the concentrated winding section Sa, since the stray capacitances $Cs_b$ or $Cs_c$ will become small in comparison with the stray capacitance $Cs_a$, the capacitance Cs will be suppressed from increasing as a whole. As a result, even if the common-mode noise currents Ic are high frequency currents, the very large inductance L will effectively act to prevent the noise currents from being introduced.

When normal-mode currents In flow through the pair of wound wires $W_i$ and $W_j$, magnetic fluxes $\phi_{ni}$ and $\phi_{nj}$ flow in the first core arm 50a as shown in FIG. 10b. Since the wound wires of each pair are closely positioned, namely a parallel pair wires contacted with each other and wound around the same magnetic path, the magnetic fluxes $\phi_{ni}$ and $\phi_{nj}$ flowing in the core 50 have the same amount and opposite flowing directions causing themselves to compensate each other. As a result, if the normal-mode current In flow, no leakage inductance Ld will be produced with little insertion loss.

Figure 11:
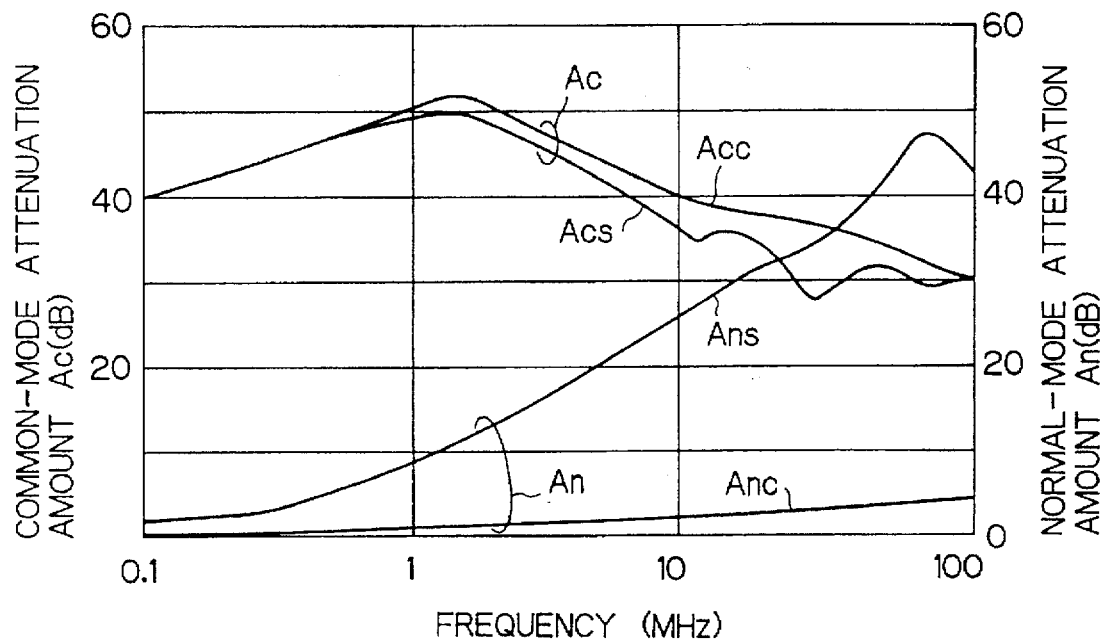
FIG. 11 shows common-mode and normal-mode attenuation characteristics of the EMC filter shown in FIG. 5.

FIG. 11 shows common-mode and normal-mode attenuation characteristics of the EMC filter shown in FIG. 5. In the figure, the axis of the abscissa indicates the frequency (MHz), and the ordinate axis indicates a common-mode attenuation amount Ac (dB) and a normal-mode attenuation amount An (dB).

Two kinds of common-mode attenuation characteristics Acc and Acs and two kinds of normal-mode attenuation characteristics Anc and Ans are indicated. Acc and Anc are characteristics using wound pair wires contacted with each other and Acs and Ans are characteristics using wound pair wires spaced with each other. The common-mode attenuation characteristics Ac does not depend upon the kind of pair wires which are used, namely whether the pair wires which are used are contacted wires or spaced wires. However, the normal-mode attenuation characteristics An exhibits different changes depending upon a type of the pair wires which are used. Namely, the normal-mode attenuation amount becomes significantly smaller when the contacted wires producing no leakage inductance are used for the pair wires than when the spaced wires are used for the pair wires.

Figure 12:
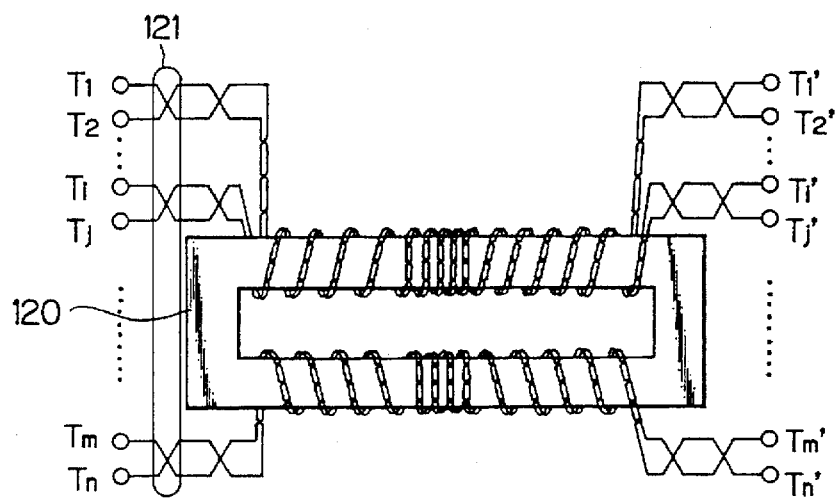
FIG. 12 shows a plane view of a second embodiment of an EMC filter according to the present invention.

FIG. 12 shows a plane view of a second embodiment of an EMC filter according to the present invention. In this embodiment, constitution of a closed magnetic path core 120 is the same as that of the core 50 in the first embodiment of FIG. 5. However, in this embodiment, each pair of the wires 121 is constituted by twisted pair wires. By using the twisted pair wires 121, since there occurs no unbalance between the wires of each pair, a small crosstalk between pair wires in the balanced multi-wired telecommunication line can be obtained. Other configurations such as a winding structure, and the advantages of this embodiment are the same as those in the first embodiment of FIG. 5.

Figure 13:
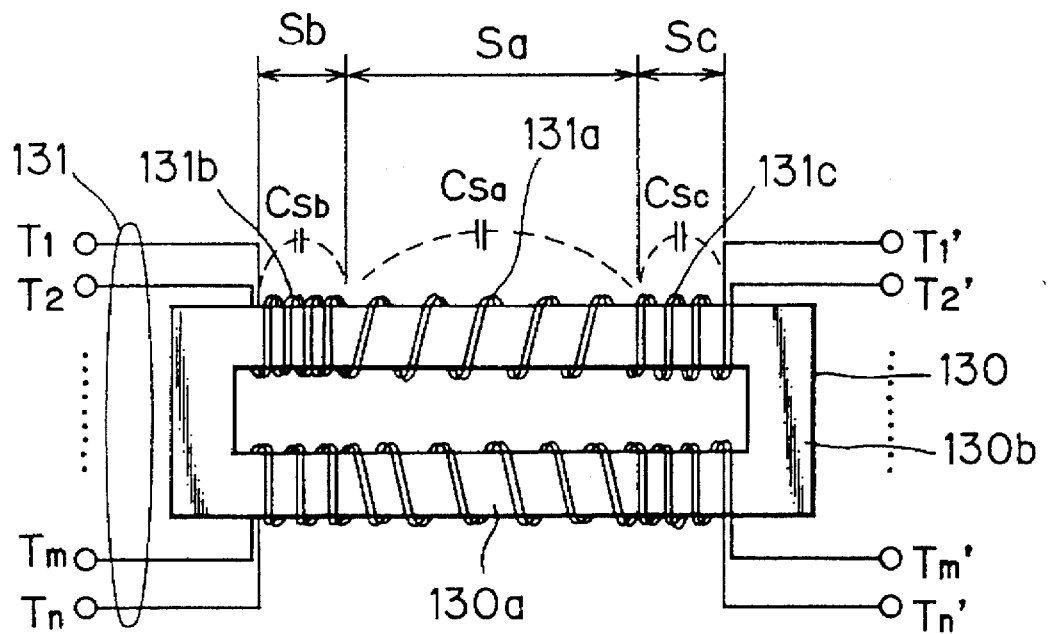
FIG. 13 shows a plane view of a third embodiment of an EMC filter according to the present invention.

FIG. 13 shows a plane view of a third embodiment of an EMC filter according to the present invention. In this embodiment, the configuration of a closed magnetic path core 130 is the same as that of the core 50 in the first embodiment of FIG. 5. Also, the configuration of each pair of wires 131 is the same as that of the pair of wires 51 in the first embodiment. However, in this embodiment, each pair of the wires 131 is wound around the core 130 in different winding structure from that of the first embodiment. Namely, each of the first core arms 130a is separated into three sections, one first section Sa and two second sections Sb and Sc along its axis. The first section Sa is longer than each of the second sections Sb and Sc. In the first section Sa positioned near a center of the first core arm 130a, each pair of wound wires 131a is distributed with a space between its neighbor windings. In the second sections Sb and Sc positioned at both sides of the first section Sa along the first core arm 130a, each pair of wound wires 131b and 131c is concentrated with no space between its neighbor windings.

Since the length of the distributed winding section Sa is sufficiently longer than that of each of the concentrated winding sections Sb and Sc, although the stray capacitances $Cs_b$ and $Cs_c$ of these sections are larger in comparison with the stray capacitance $Cs_a$, the total capacitance Cs will be suppressed from increasing as a whole by an action of small $Cs_a$. As a result, even if the common-mode noise currents are high frequency currents, the very large inductance will effectively act to prevent the noise currents from being introduced. Other elements and advantages in this embodiment are the same as those in the first embodiment of FIG. 5.

Figure 14:
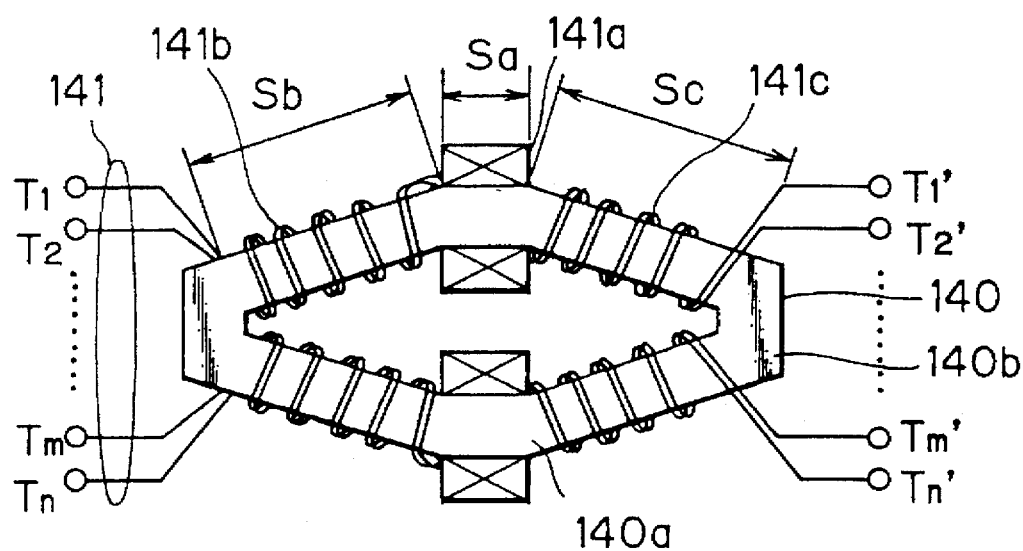
FIG. 14 shows a plane view of a fourth embodiment of an EMC filter according to the present invention.

FIG. 14 shows a plane view of a fourth embodiment of an EMC filter according to the present invention. In this embodiment, a shape of a closed magnetic path core 140 and a winding structure of each pair of wires 141 are different from those of the core 50 and the pair wires 51 in the first embodiment of FIG. 5, respectively. Namely, the closed magnetic path core 140 consists of a (symmetrical) rhombus-like loop core. This loop core is formed by connecting two first core arms 140a and two second core arms 140b which are shorter than the first core arms 140a with each other. Therefore, a distance between the two first core arms 140a becomes the largest at centers of the arms 140a. Along its axis, each of the first core arms 140a is separated into three sections, namely two first sections Sb and Sc and one second section Sa, as shown in FIG. 14. In the first sections Sb and Sc positioned at both sides of the second section Sa, each pair of the wound wires 141b and 141c is distributed with a space between its neighbor windings. In the second section Sa positioned near the center of the first core arm 140a, each pair of the wound wires 141a is concentrated in a multi-layered form with no space between its neighbor windings. Since there is a sufficient distance between the first core arms 140a near there centers, a large number of turns of pair wires can be wound at this second section Sa in a multi-layered form. Accordingly, the inductance can be effectively increased even if the core size is small. Other elements and advantages in this embodiment are the same as those in the first embodiment of FIG. 5.

Figure 15:
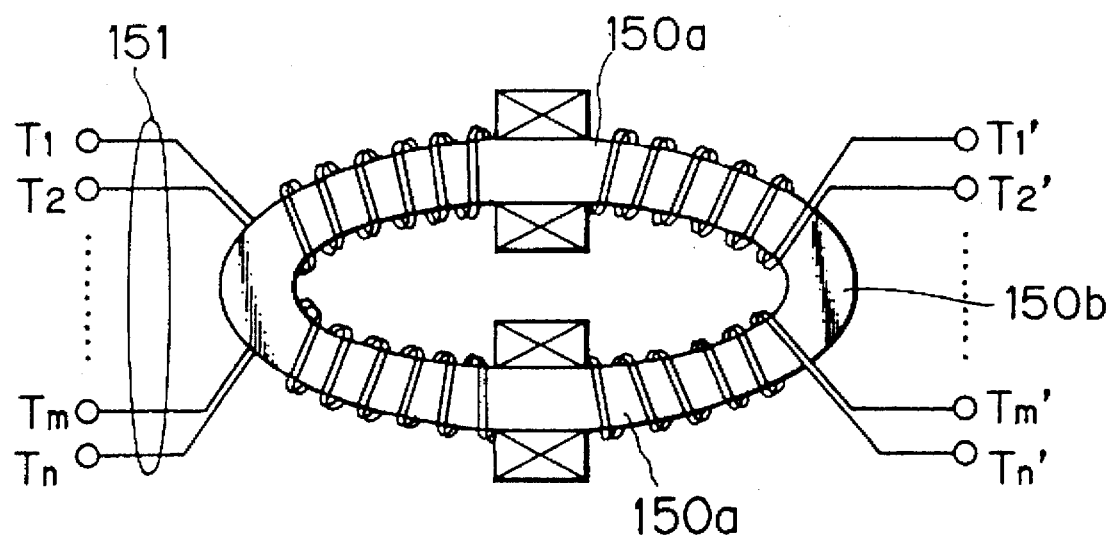
FIG. 15 shows a plane view of a fifth embodiment of an EMC filter according to the present invention.

FIG. 15 shows a plane view of a fifth embodiment of an EMC filter according to the present invention. In this embodiment, except that a closed magnetic path core 150 consists of an (symmetrical) oval loop core with two first core arms 150a and two second core arms 150b connected with each other, configurations such as pair wires 151 and advantages are the same as those in the fourth embodiment of FIG. 14.

Figure 16:
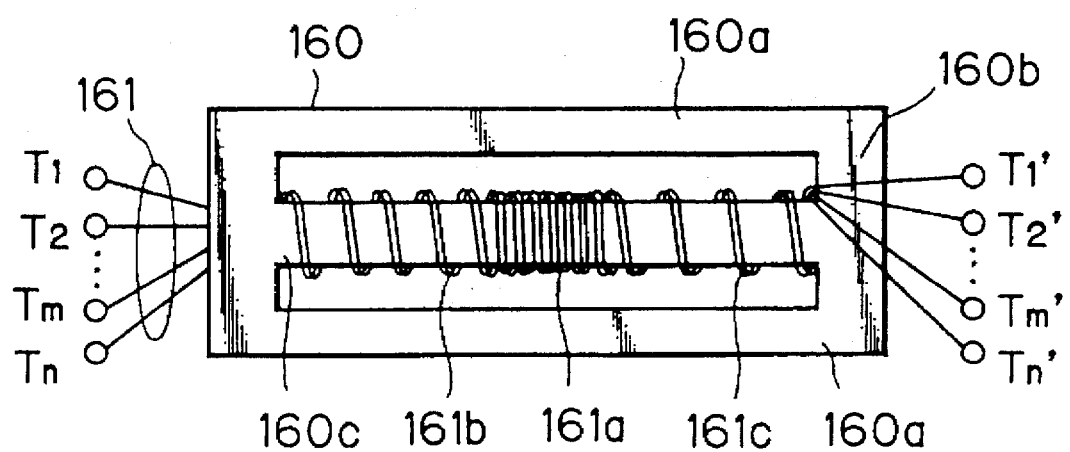
FIG. 16 shows a plane view of a sixth embodiment of an EMC filter according to the present invention.

FIG. 16 shows a plane view of a sixth embodiment of an EMC filter according to the present invention. In this embodiment, a closed magnetic path core 160 of a (symmetrical) rectangular loop consists of a center core arm 160c (first core arm), two side core arms 160a in parallel with the center core arm 160c, and two second core arms 160b connected to both ends of the center core arm 160c and the side core arms 160b so as to provide two closed magnetic paths. The center core arm 160c and side core arms 160a are longer than the second core arms 160b. Around the center core arm 160c, pairs of wires 161 are wound as well as the pair wires 51 in the first embodiment of FIG. 5. Namely, the center are arm 160c is separated into three sections along its axis, two first sections and one second section. In the first sections positioned at both sides of the second section, each pair of the wound wires 161b and 161c is distributed with a space between its neighbor windings. In the second positioned near a center of the center core arm 160c, each pair of the wound wires 161a is concentrated with no space between its neighbor windings. This concentrated winding section can be constituted by multi-layered wound pair wires. Other configurations and advantages in this embodiment are the same as those in the first embodiment of FIG. 5.

Figure 17:
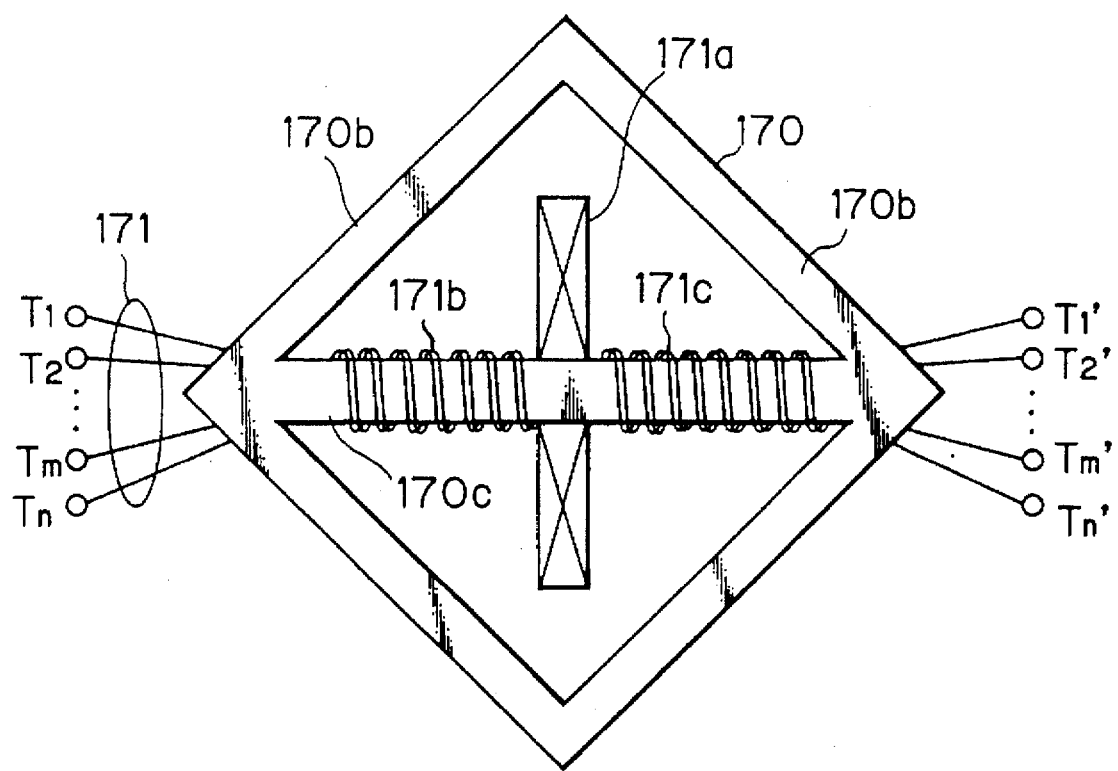
FIG. 17 shows a plane view of a seventh embodiment of an EMC filter according to the present invention.

FIG. 17 shows a plane view of a seventh embodiment of an EMC filter according to the present invention. In this embodiment, a closed magnetic path core 170 of a (symmetrical) rhombus loop consists of a diagonal center core arm 170c (first core arm), and four side core arms 170b (second core arms) connected to both ends of the diagonal center core arm 170c. The diagonal center core arm 170c is longer than the side core arms 170b. Around the diagonal center core arm 170c, pairs of wires 171 are wound as well as the pair wires 141 in the fourth embodiment of FIG. 14. Namely, the diagonal center core 170c is separated into three sections along its axis, two first sections and one second section. In the first sections positioned at both sides of the second section, each pair of the wound wires 171b and 171c is distributed with a space between its neighbor windings. In the second section positioned near a center of the diagonal center core 170c, each pair of the wound wires 171a is concentrated in a multi-layered form with no space between its neighbor windings. Other elements and advantages in this embodiment are the same as those in the first and fourth embodiments of FIGS. 5 and 14.

Figure 18:
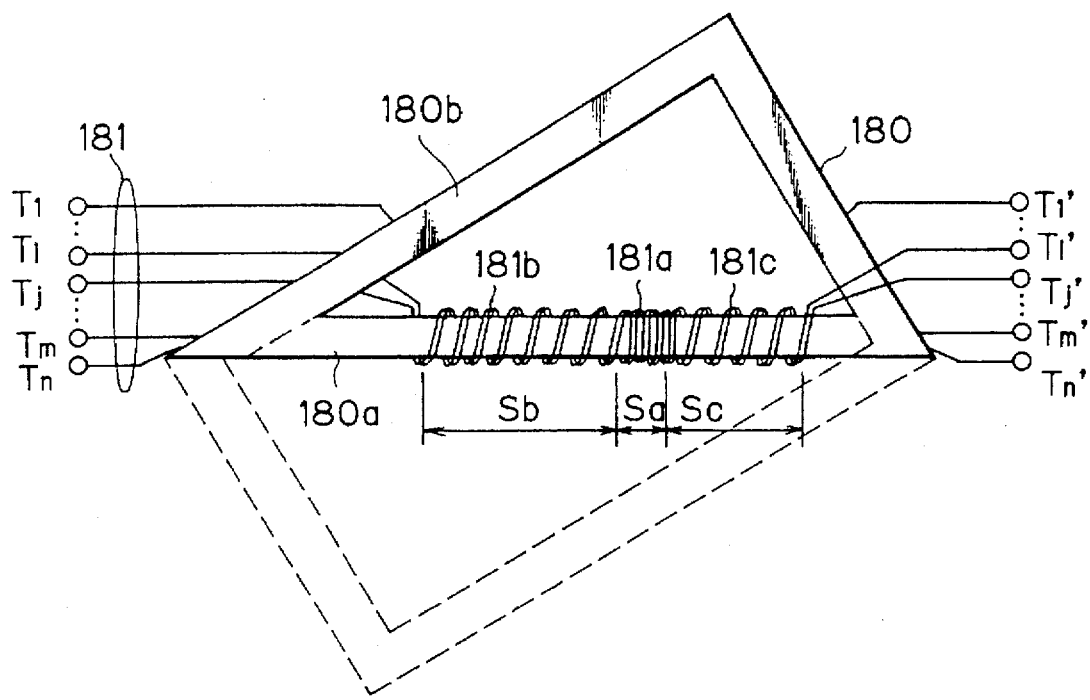
FIG. 18 shows a plane view of an eighth embodiment of an EMC filter according to the present invention.

FIG. 18 shows a plane view of an eighth embodiment of an EMC filter according to the present invention. In this embodiment, a closed magnetic path core 180 of a (asymmetrical) triangular (half of a rectangular) loop consists of one side core arm (first core arm) 180a, and two side core arms (second core arms) 180b shorter than the side core arm 180a. Around the side core arm 180a, pairs of wires 181 are wound as well as the pair wires 51 in the first embodiment of FIG. 5. Namely, the side core arm 180a is separated into three sections along its axis, two first sections Sb and Sc and one second section Sa. In the first sections Sb and Sc positioned at both sides of the second section Sa, each pair of the wound wires 181b and 181c is distributed with a space between its neighbor windings. In the second section Sa positioned near a center of the side core arm 180a, each pair of the wound wires 181a is concentrated with no space between its neighbor windings. Except for the asymmetrical structure of the core 180, the other elements and advantages in this embodiment are the same as those in the first embodiment of FIG. 5.

Figure 19:
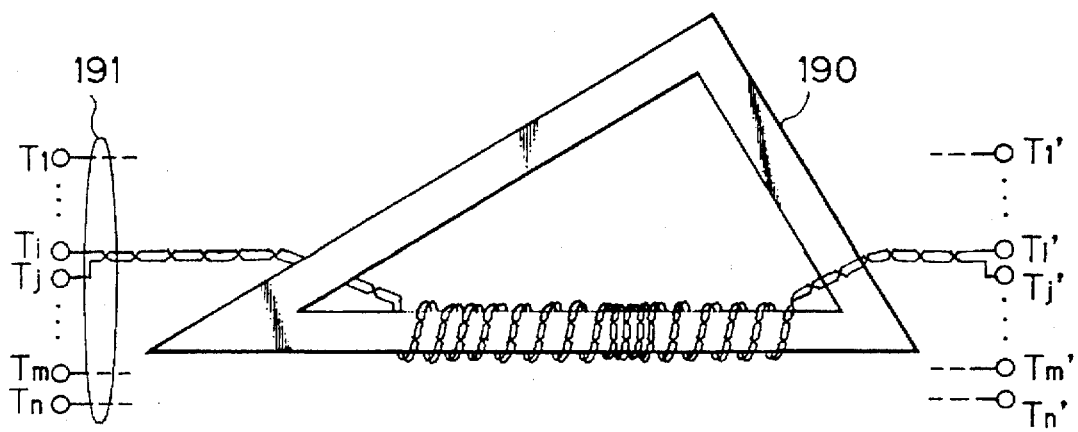
FIG. 19 shows a plane view of a ninth embodiment of an EMC filter according to the present invention.

FIG. 19 shows a plane view of a ninth embodiment of an EMC filter according to the present invention. In this embodiment, the configuration of a closed magnetic path core 190 is the same as that of the core 180 in the eighth embodiment of FIG. 18. However, in this embodiment, each pair of the wires 191 is formed by a twisted pair wires. By using the twisted pair wires 191, since there occurs no unbalance between the wires of each pair, a small crosstalk between pair wires in the balanced multi-wired telecommunication line can be obtained. Other elements and advantages in this embodiment are the same as those in the first embodiment of FIG. 5.

Figure 20:
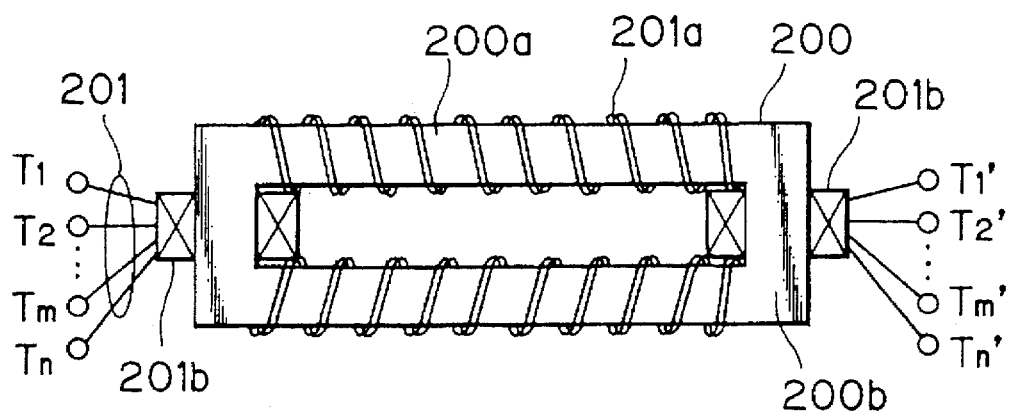
FIG. 20 shows a plane view of a tenth embodiment of an EMC filter according to the present invention.

FIG. 20 shows a plane view of a tenth embodiment of an EMC filter according to the present invention. In this embodiment, constitution of a closed magnetic path core 200 with two parallel first core arms 200a and two parallel second core arms 200b is the same as that of the core 50 in the first embodiment of FIG. 5. Also, the configuration of each pair of wires 201 is the same as that of the pair wires 51 in the first embodiment. However, in this embodiment, each pair of the wires 201 is wound around the core 200 in different winding structure from that of the first embodiment. Namely, each pair of the wires 201a is wound so as to be distributed with a space between its neighbor windings along the whole length of each of first core arms 200a, and each pair of the wires 201b is wound around the second core arms 200b so as to be concentrated in a multi-layered form with no space between its neighbor windings. Since there is a sufficient distance between the second core arms 200b, a large number of turns of pair wires can be wound in a multi-layered form. Accordingly, the inductance can be effectively increased even if the core size is small. Also, since the length of the distributed winding section (first core arm) is enough longer than that of the concentrated winding section (a part of the second core arm), the total capacitance will be suppressed from increasing as a whole. As a result, even if the common-mode noise currents are high frequency currents, a very large inductance will effectively act to suppress the noise currents from being introduced. Other elements and advantages in this embodiment are the same as those in the first embodiment of FIG. 5.

Figure 21:
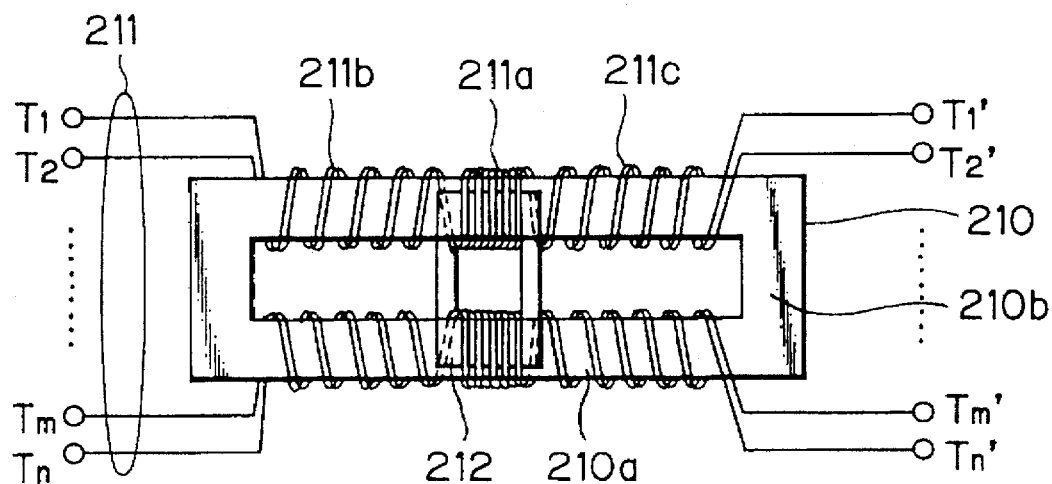
FIG. 21 shows a plane view of an eleventh embodiment of an EMC filter according to the present invention.

FIG. 21 shows a plane view of an eleventh embodiment of an EMC filter according to the present invention. In this embodiment, the configuration of a closed magnetic path core 210 with two parallel first core arms 210a and two parallel second core arms 210b is the same as that of the core 50 in the first embodiment of FIG. 5. Also, a winding structure of pair wires 211 wound in distributed winding sections (211b and 211c) and concentrated winding sections (211a) in the first core arms 210a is the same as that of the pair wires 51 in the first embodiment. However, in this embodiment, an additional closed magnetic path core 212 of a rectangular loop is laid across the centers (concentrated winding sections) of the two first core arms 210a, and the pair wires 211a in the concentrated winding sections are wound around the additional closed magnetic path core 212 in common with the first core arms 210a.

Since the total capacitance can be prevented from increasing in spite of a large stray capacitance at the commonly wound portion and also since a common-mode inductance at low frequency range can be increased to a necessary value by using the additional core 212 with an appropriate magnetic permeability, an excellent noise suppression capability against common-mode noise current with high frequency component can be obtained over a wide frequency range as a whole. Other elements and advantages in this embodiment are the same as those in the first embodiment of FIG. 5.

Figure 22:
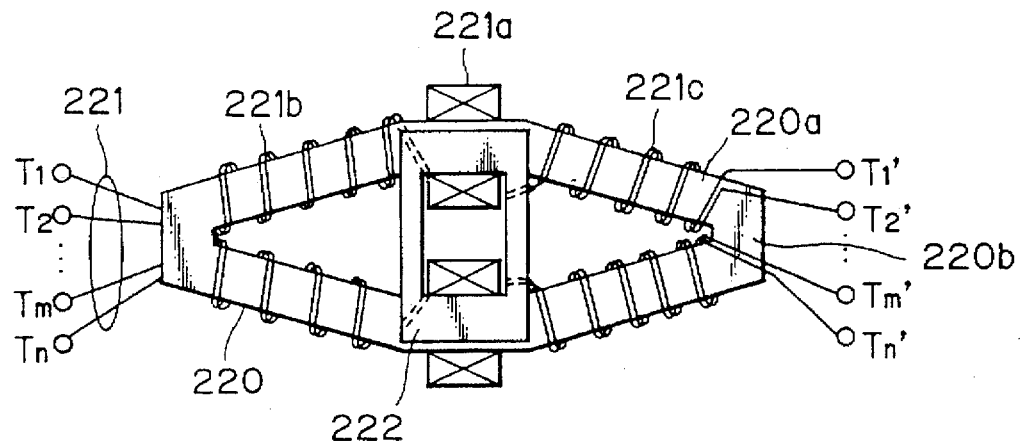
FIG. 22 shows a plane view of a twelfth embodiment of an EMC filter according to the present invention.

FIG. 22 shows a plane view of a twelfth embodiment of an EMC filter according to the present invention. In this embodiment, constitution of a closed magnetic path core 220 with two first core arms 220a and two second core arms 220b is the same as that of the core 140 in the fourth embodiment of FIG. 14. Also, a winding structure of pair wires 221 wound in distributed winding sections (221b and 221c) and concentrated winding sections (221a) in the first core arms 220a is the same as that of the pair wires 141 in the fourth embodiment. However, in this embodiment, an additional closed magnetic path core 222 of a rectangular loop is laid across the centers (concentrated winding sections) of the two first core arms 220a, and the pair wires 221a in the concentrated winding sections are wound around the additional closed magnetic path core 222 in common with the first core arms 220a.

Since the total capacitance can be suppressed from increasing in spite of a large stray capacitance at the commonly wound portion and also since a common-mode inductance at low frequency range can be increased to a necessary value by using the additional core 222 with a an appropriate magnetic permeability, an excellent noise suppression capability against common-mode noise currents with high frequency component can be obtained over a wide frequency range as a whole. Other elements and advantages in this embodiment are the same as those in the fourth embodiment of FIG. 14.

Figure 23:
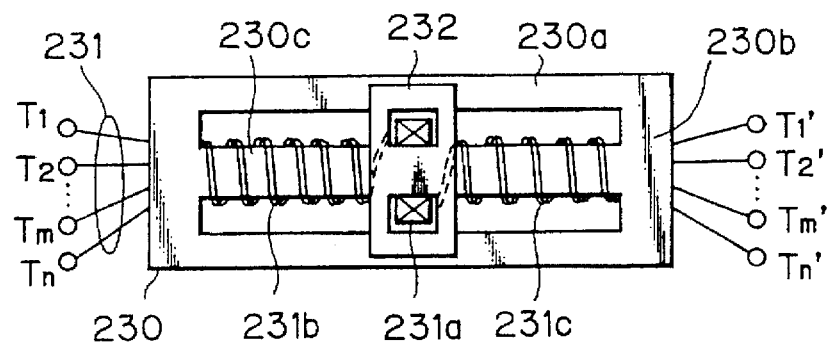
FIG. 23 shows a plane view of a thirteenth embodiment of an EMC filter according to the present invention.

FIG. 23 shows a plane view of a thirteenth embodiment of an EMC filter according to the present invention. In this embodiment, the configuration of a closed magnetic path core 230 with a center core arm 230c, two side core arms 230a and two second core arms 230b is the same as that of the core 160 in the sixth embodiment of FIG. 16. Also, a winding structure of pair wires 231 wound in distributed winding sections (231b and 231c) and a concentrated winding section (231a) in the center core arm 230c is the same as that of the pair wires 161 in the sixth embodiment except that the concentrated wound pair wires 231a is multi-layered in this embodiment. However, in this embodiment, an additional closed magnetic path core 232 of a rectangular loop having a center core is laid across the centers (concentrated winding sections) of the two side core arms 230a via the center core arm 230c, and the pair wires 231a in the concentrated winding sections are wound around the center arm of the additional closed magnetic path core 232 in common with the first core arms 210a.

Since the total capacitance can be prevented from increasing in spite of a large stray capacitance at the commonly wound portion and also since a common-mode inductance at low frequency range can be increased to a necessary value by using the additional core 232 with an appropriate magnetic permeability, an excellent noise suppression capability against common-mode noise currents with high frequency component can be obtained over a wide frequency range as a whole. Other elements and advantages in this embodiment are the same as those in the sixth embodiment of FIG. 16.

Figure 24:
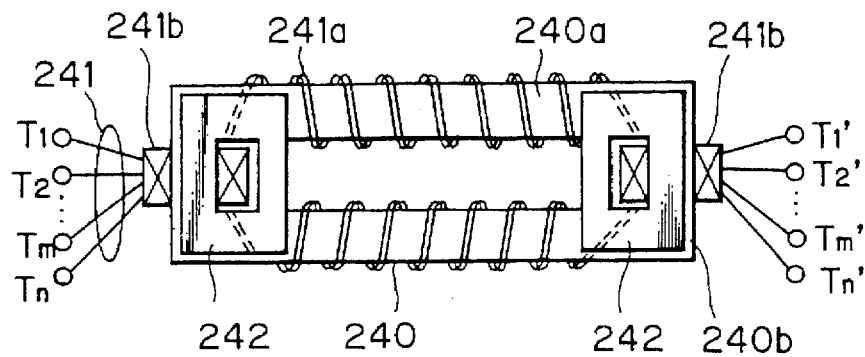
FIG. 24 shows a plane view of a fourteenth embodiment of an EMC filter according to the present invention.

FIG. 24 shows a plane view of a fourteenth embodiment of an EMC filter according to the present invention. In this embodiment, the configuration of a closed magnetic path core 240 with two parallel first core arms 240a and two parallel second core arms 240b is the same as that of the core 200 in the tenth embodiment of FIG. 20. Also, a winding structure of pair wires 241 wound in distributed (241a) around the first core arms 240a and in concentrated (241b) around the second core arms 240b is the same as that of the pair wires 201 in the tenth embodiment. However, in this embodiment, additional closed magnetic path cores 242 of a rectangular loop are laid across the side portions (concentrated winding sections) of the two first core arms 240a, and the pair wires 241b in concentrated are wound around the additional closed magnetic path cores 242 in common with the second core arms 240b, respectively.

Since the total capacitance can be suppressed from increasing in spite of a large stray capacitance at the commonly wound portion and also since a common-mode inductance at low frequency range can be increased to a necessary value by using the additional cores 242 with an appropriate magnetic permeability, an excellent noise suppression capability against common-mode noise currents with high frequency component can be obtained over a wide frequency range as a whole. Other elements and advantages in this embodiment are the same as those in the tenth embodiment of FIG. 20.

Figure 25:
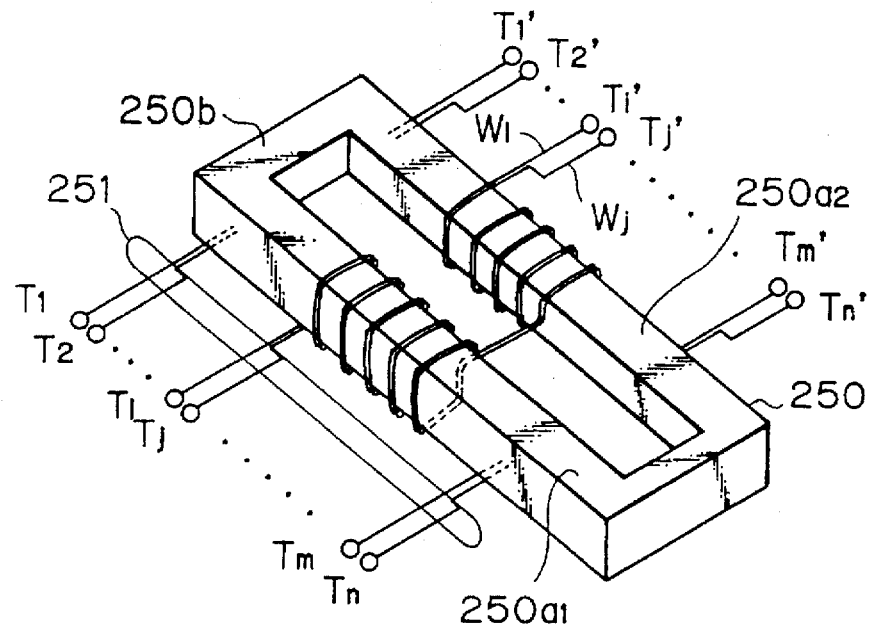
FIGS. 25a and 25b show an oblique view and an exploded oblique view of a fifteenth embodiment of an EMC filter according to the present invention.
Figure 25:
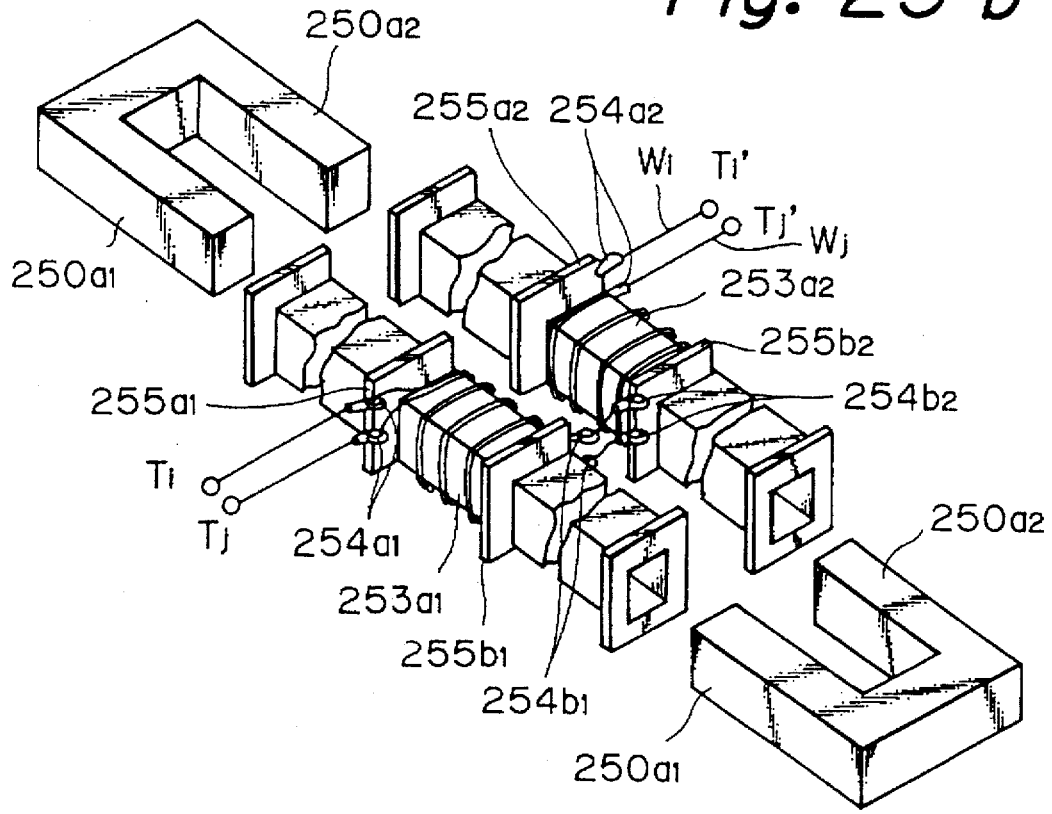

FIG. 25a shows an oblique view of a schematic structure of a fifteenth embodiment of an EMC filter according to the present invention, and FIG. 25b shows an exploded oblique view clearly illustrating this fifteenth embodiment.

In FIG. 25a, a reference numeral 250 denotes a closed magnetic path core of a (symmetrical) rectangular loop with two parallel first core arms $250a_1$ and $250a_2$ and two parallel second core arms 250b. The first core arms $250a_1$ and $250a_2$ are longer than the second core arms 250b, and these first core arms $250a_1$ and $250a_2$ and second core arms 250b are connected with each other to form a closed magnetic path. The rectangular loop core 250 has an effective magnetic permeability μ which is substantially equal to that of the conventional toroidal core 10 shown in FIGS. 1a and 1b.

Around the first core arms $250a_1$ and $250a_2$, one pair or more pairs of wires 251 are wound to form a plurality of coils which will be connected to respective wires of a balanced multi-wired telecommunication line (not shown). In FIGS. 25a and 25b and also in the following figures, only a typical pair or pairs of coiled wires are illustrated to simplify an understanding of the winding structure. A pair of wires are, in FIGS. 25a and 25b, illustrated by $W_i$ and $W_j$ for example. Each of the pairs ($W_i$ and $W_j$) is wound around one of the first core arms $250a_1$ in a turning direction and then around the other one of the first core arms $250a_2$ in the opposite turning direction so as to produce magnetic fluxes in the closed core 250 flowing toward the same direction when a common-mode current flows through the wires.

The coils have signal input ends (input terminals) $T_1$, $T_2$, ..., $T_i$, $T_j$, ... $T_m$, $T_n$ at the outside of the one first core arm $250a_1$ and signal output ends (output terminal) $T_1'$, $T_2'$, ..., $T_i'$, $T_j'$, ... $T_m'$, $T_n'$ at the opposite outside of the other first core arm $250a_2$. The wires run in a one-way direction from the signal input ends $T_1, T_2, ..., T_i, T_j, ...$ $T_m$, $T_n$ at the input side first core arm $250a_1$ to the signal output ends $T_1', T_2', ..., T_m', T_n'$ at the output side first core arm 250a. Namely, each pair of the wires for example pair wires $W_i$ and $W_j$ is started from the signal input ends $T_i$ and $T_j$, wound in a distributed fashion with a space between its neighbor windings along the input side first core arm $250a_1$ toward a first axial direction, introduced to the output side first core arm $250a_2$, wound in distributed with a space between its neighbor windings along this core arm $250a_2$ toward a second axial direction opposite to the first axial direction, and arrived at the signal output ends $T_i'$ and $T_j'$.

The wires of each pair are closely positioned with respect to each other. Namely, in this embodiment, the wires of each pair are constituted by parallel pair wires contacted with each other.

As shown in FIG. 25b, each pair of the wires is wound on a winding section of one coil bobbin $253a_1$ in a turning direction and also wound on a winding section of the other one of coil bobbin $253a_2$ in the opposite turning direction. One ends of the wound pair wires are electrically connected with terminals $254a_1$ and $254a_2$ attached to respective separation boards $255a_1$ and $255a_2$ for separating to form the respective winding section of the coil bobbins $253a_1$ and $253a_2$. The other ends of the wound pair wires are also electrically connected with terminals $254b_1$ and $254b_2$ attached to respective other separation boards $255b_1$ and $255b_2$, respectively. The terminals $254b_1$ and $254b_2$ are electrically connected with each other. Therefore, the pair wires $W_i$ and $W_j$ wound around the coil bobbins $253a_1$ and $253a_2$ are formed. Other pairs of wires are similarly wound around the coil bobbins. Then, the separated first core arms $250a_1$ and $250a_2$ are inserted into and fixed to the coil bobbins $253a_1$ and $253a_2$.

Figure 26:
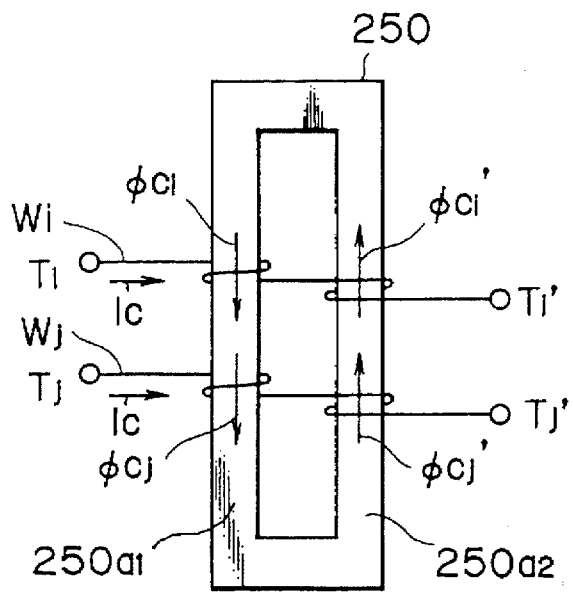
FIGS. 26a and 26b show plane views for illustrating operations of the EMC filter of the fifteenth embodiment shown in FIGS. 25a and 25b against common-mode noise currents Ic and signal currents In flowing through the pair wound wires $W_i$ and $W_j$, respectively.
Figure 26:
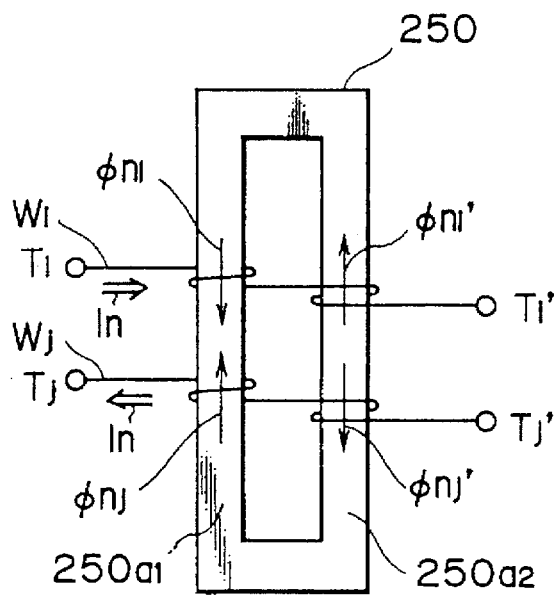

FIGS. 26a and 26b illustrate plane views for illustrating the operation of the EMC filter of the embodiment shown in FIGS. 25a and 25b against common-mode noise currents Ic and signal currents (normal-mode currents) In flowing through the pair wound wires $W_i$ and $W_j$, respectively. In these figures, although the pair of wires are indicated in separation with each other, these wires $W_i$ and $W_j$ are parallel pair wires contacted with each other.

When common-mode noise currents Ic flow through the pair wound wires $W_i$ and $W_j$, magnetic fluxes $\phi_{ci}$ and $\phi_{cj}$ flow in the first core arms $250a_1$ and $250a_2$ as shown in FIG. 26a. Since these magnetic fluxes $\phi_{ci}$ and $\phi_{cj}$ flow through the closed loop core 250 in the same direction, a total magnetic flux is increased. In fact, as magnetic fluxes due to other coils not shown in FIG. 26a are added, a total inductance L will be increased to a very large value. As will be apparent from FIGS. 25a and 25b, since each pair of wires are wound in distributed and also separately wound on the two first core arms $250a_1$ and $250a_2$, stray capacitance between its input ends and output ends will be suppressed from increasing as a whole. As a result, even if the common-mode noise currents Ic are high frequency currents, the large inductance L will effectively act to suppress the noise currents from being introduced.

When normal-mode currents In flow the pair wound wires $W_i$ and $W_j$, magnetic fluxes $\phi_{ni}$ and $\phi_{nj}$ flow in the first core arm $250a_1$ and $250a_2$ as shown in FIG. 26b. Since the wound wires of each pair are closely positioned, namely a parallel pair wires contacted with each other and wound around the same magnetic path, the magnetic fluxes $\phi_{ni}$ and $\phi_{nj}$ flowing in the core 250 have the same amount and opposite flowing directions causing themselves to compensate each other. As a result, if the normal-mode currents In flow, no leakage inductance Ld will be produced with little insertion loss. Another constitution and advantages in this embodiment are the same as those in the first embodiment of FIG. 5.

Figure 27:
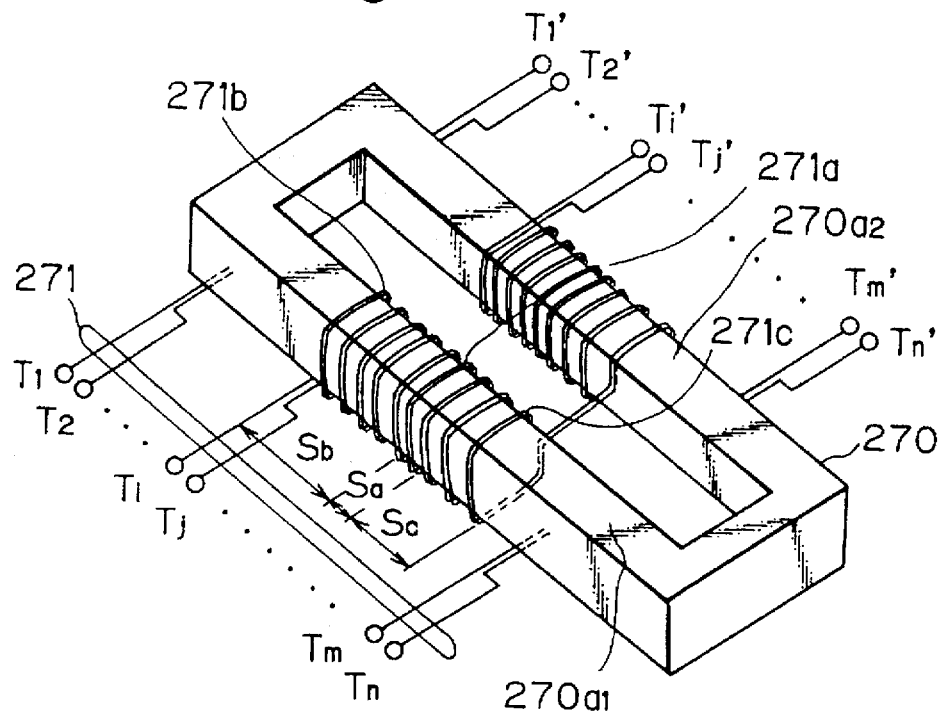
FIG. 27 shows an oblique view of a sixteenths embodiment of an EMC filter according to the present invention.

FIG. 27 shows an oblique view of a sixteenth embodiment of an EMC filter according to the present invention. In this embodiment, constitution of a closed magnetic path core 270 is the same as that of the core 250 in the fifteenth embodiment of FIGS. 25a and 25b. Also, constitution of each pair of wires 271 is the same as that of the pair wires 251 in the fifteenth embodiment. However, in this embodiment, each pair of the wires 271 is wound around first core arms $270a_1$ and $270a_2$ in different winding structure from that of the fifteenth embodiment. Namely, in this sixteenth embodiment, each of the first core arms $270a_1$ and $270a_2$ is separated into three sections, two first sections Sb and Sc and one second section Sa. In the first sections Sb and Sc positioned at both sides of the second section Sa, each pair of the wound wires 271b and 271c is distributed with a space between its neighbor windings. In the second section Sa positioned near a center of its winding length of the first core arms $270a_1$ and $270a_2$, each pair of the wound wires 271a is concentrated with no space between its neighbor windings.

Since the total length of the distributed winding sections Sb and Sc is sufficiently longer than that of the concentrated winding section Sa, although the stray capacitance of this concentrated winding section is large in comparison with the stray capacitances in the distributed winding sections, the total capacitance will be suppressed from increasing as a whole. As a result, even if the common-mode noise currents are high frequency currents, the large inductance will effectively act to suppress the noise currents from being introduced. Another constitution and advantages in this embodiment are the same as those in the fifteenth embodiment of FIGS. 25a and 25b.

Figure 28:
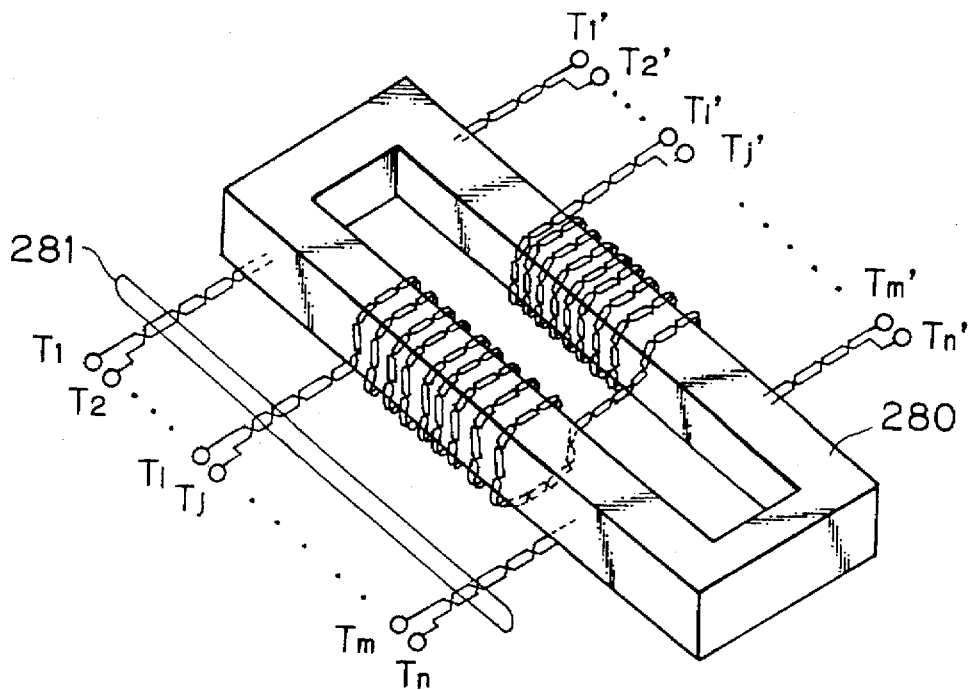
FIG. 28 shows an oblique view of a seventeenth embodiment of an EMC filter according to the present invention.

FIG. 28 shows an oblique view of a seventeenth embodiment of an EMC filter according to the present invention. In this embodiment, the configuration of a closed magnetic path core 280 is the same as that of the core 270 in the sixteenth embodiment of FIG. 27. However, in this embodiment, each pair of the wires 281 is constituted by a twisted pair wires. By using the twisted pair wires 281, since there occurs no unbalance between the wires of each pair, a small crosstalk between pair wires in the balanced multi-wired telecommunication line can be obtained. Other elements and advantages in this embodiment are the same as those in the sixteenth embodiment of FIG. 27.

Figure 29:
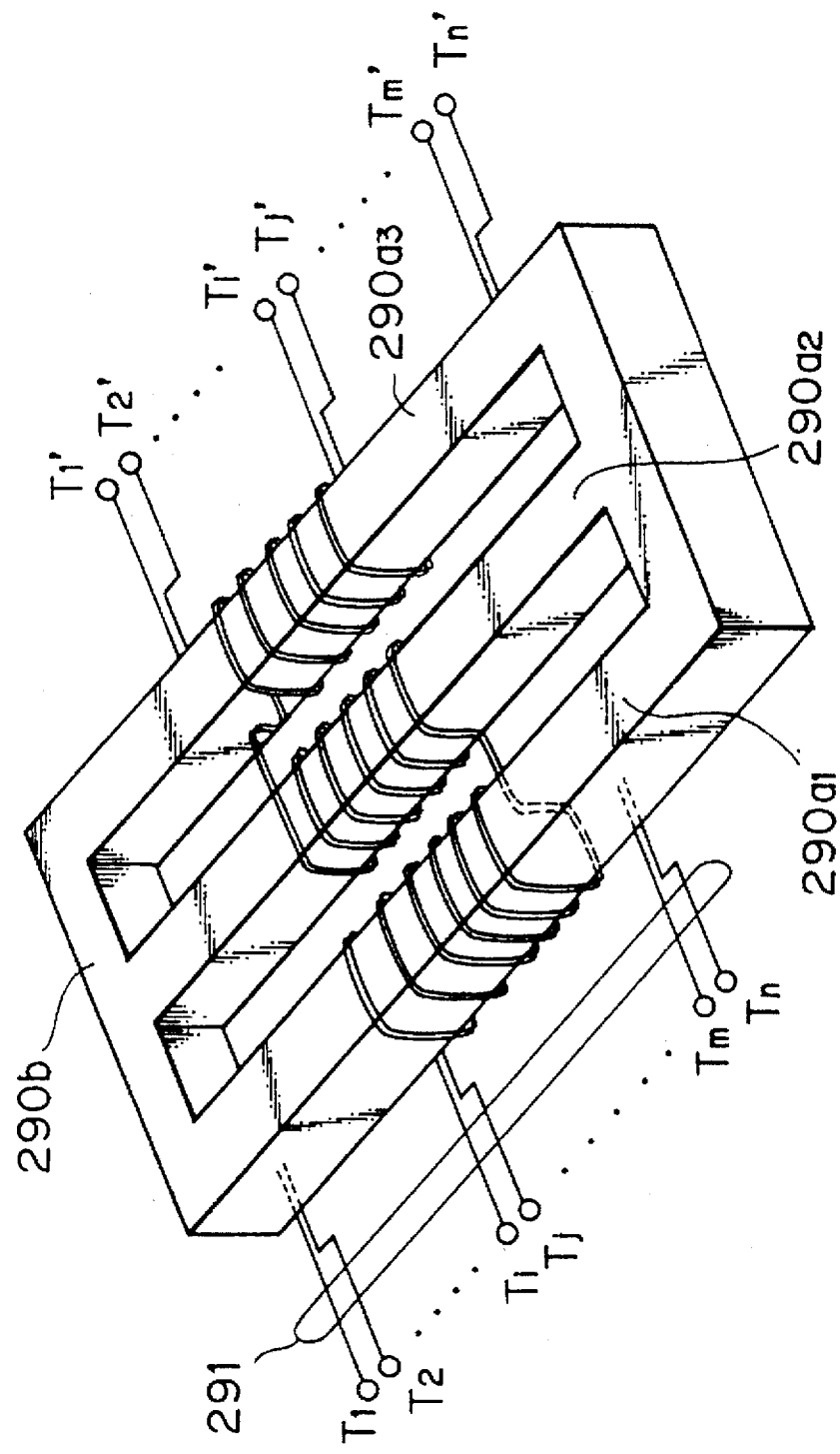
FIG. 29 shows an oblique view of an eighteenth embodiment of an EMC filter according to the present invention.

FIG. 29 shows an oblique view of an eighteenth embodiment of an EMC filter according to the present invention. In this embodiment, a closed magnetic path core 290 of a (symmetrical) rectangular loop consists of a center core arm $290a_2$ (first core arm), side core arms $290a_1$ and $290a_3$ (first core arms) in parallel with the center core arm $290a_2$, and second core arms 290b connected to both ends of the center core arm $290a_2$ and the side core arms $290a_1$ and $290a_3$ so as to provide two closed magnetic paths. The center core arm $290a_2$ and side core arms $290a_1$ and $290a_3$ are longer than the second core arm 290b. Around the side core arm $290a_1$, the center core arm $290a_2$, and the side core arms $290a_3$, pairs of wires 291 are wound as well as the pair wires 251 in the fifteenth embodiment of FIGS. 25a and 25b. Namely, each pair of the wires for example pair wires $W_i$ and $W_j$ is started from the signal input ends $T_i$ and $T_j$, wound in distributed with a space between its neighbor windings along the input side core arm $290a_1$ toward a first axial direction, introduced to the center core arm $290a_2$, wound in distributed fashion with a space between its neighbor windings along this center core arm $290a_2$ toward a second axial direction opposite to the first axial direction, introduced to the output side core arm $290a_3$, wound in distributed fashion with a space between its neighbor windings along this side core arm $290a_3$ toward the first axial direction, and arrived at the signal output ends $T_i'$ and $T_j'$.

Figure 30:
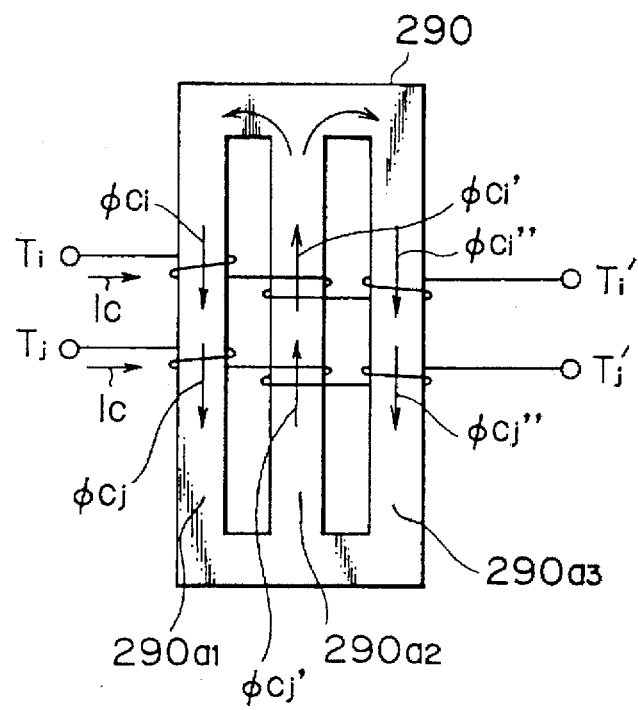
FIGS. 30a and 30b show plane views for illustrating operations of the EMC filter of the eighteenth embodiment shown in FIG. 29 against common-mode noise currents Ic and signal currents In flowing through the pair wound wires $W_i$ and $W_j$, respectively.
Figure 30:
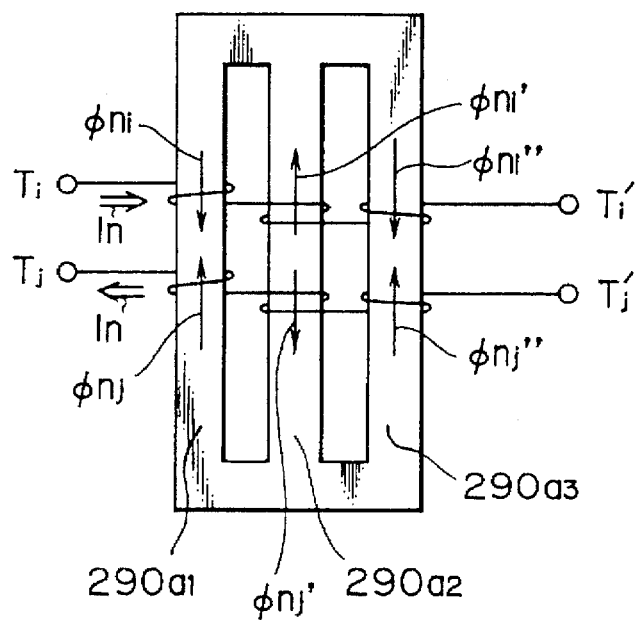

FIGS. 30a and 30b show plane views for illustrating operations of the EMC filter of the embodiment shown in FIG. 29 against common-mode noise currents Ic and signal currents (normal-mode currents) In flowing through the pair wound wires $W_i$ and $W_j$, respectively. In these figures, although the pair wires are indicated in separation with each other, these wires $W_i$ and $W_j$ are a parallel pair wires contacted with each other.

When common-mode noise currents Ic flow through the pair wound wires $W_i$ and $W_j$, magnetic fluxes $\phi_{ci}$ and $\phi_{cj}$ flow in the side core arm $290a_1$, magnetic fluxes $\phi_{ci}'$ and $\phi_{cj}'$ flow in the center core arm $290a_2$, and magnetic fluxes $\phi_{ci}''$ and $\phi_{cj}''$ flow in the side core arm $290a_3$ as shown in FIG. 30a. Since these magnetic fluxes $\phi_{ci}$, $\phi_{cj}$, $\phi_{ci}'$, $\phi_{cj}'$, $\phi_{ci}''$ and $\phi_{cj}''$ flow through the closed loop core 290 in the same direction, a total magnetic flux is increased. In fact, as magnetic fluxes due to another coils not shown in FIG. 30a are added, a total inductance L will be increased to a very large value. As will be apparent from FIG. 29, since each pair of wires are wound in a distributed fashion and also separately wound on the three core arms $290a_1$, $290a_2$ and $290a_3$, stray capacitance between its input ends and output ends, the stray capacitance Cs will be suppressed from increasing as a whole. As a result, even if the common-mode noise currents Ic are high frequency currents, the large inductance L will effectively act to suppress the noise currents from being introduced.

When normal-mode currents In flow through the pair wound wires $W_i$ and $W_j$, magnetic fluxes $\phi_{ni}$ and $\phi_{nj}$ flow in the first core arm $290a_1$, magnetic fluxes $\phi_{ni}'$ and $\phi_{nj}'$ flow in the center core arm $290a_2$, and magnetic fluxes $\phi_{ni}''$ and $\phi_{nj}''$ flow in the side core arm $290a_3$ as shown in FIG. 30b. Since the wound wires of each pair are closely positioned, namely a parallel pair wires contacted with each other and wound around the same magnetic path, the magnetic fluxes flowing in the core 290 have the same amount and opposite flowing directions causing themselves to compensate each other. As a result, if the normal-mode currents In flow, no leakage inductance Ld will be produced with little insertion loss. Other elements and advantages in this embodiment are the same as those in the fifteenth embodiment of FIGS. 25a and 25b.

Figure 31:
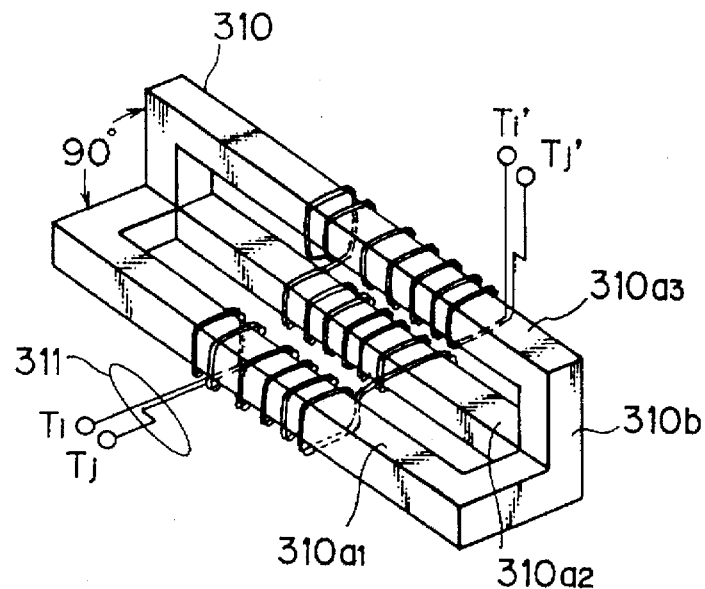
FIG. 31 shows an oblique view of a nineteenth embodiment of an EMC filter according to the present invention.

FIG. 31 shows an oblique view of the nineteenth embodiment of an EMC filter according to the present invention. In this embodiment, a closed magnetic path core 310 with a (asymetrical) solid shape consists of a corner core arm $310a_2$ (first core arm), side core arms $310a_1$ and $310a_3$ (first core arms) in parallel with the corner core arm $310a_2$, and second core arms 310b connected to both ends of the corner core arm $310a_2$ and the side core arms $310a_1$ and $310a_3$ so as to provide two closed magnetic paths. A plane including the side core arm $310a_1$ and the corner core arm $310a_2$ intersects with a plane including the corner core arm $310a_2$ and the side core arm $310a_3$ at right-angle (90°) so that the section of these planes is L-shaped. The corner core arm $310a_2$ and side core arms $310a_1$ and $310a_3$ are longer than the second core arms 310b. Around the side core arm $310a_3$, the corner core arm $310a_2$, and the side core arms $310a_3$, pairs of wires 311 are wound as well as the pair wires 291 in the eighteenth embodiment of FIG. 29. Other elements and advantages in this embodiment are the same as those in the eighteenth embodiment of FIG. 29.

Figure 32:
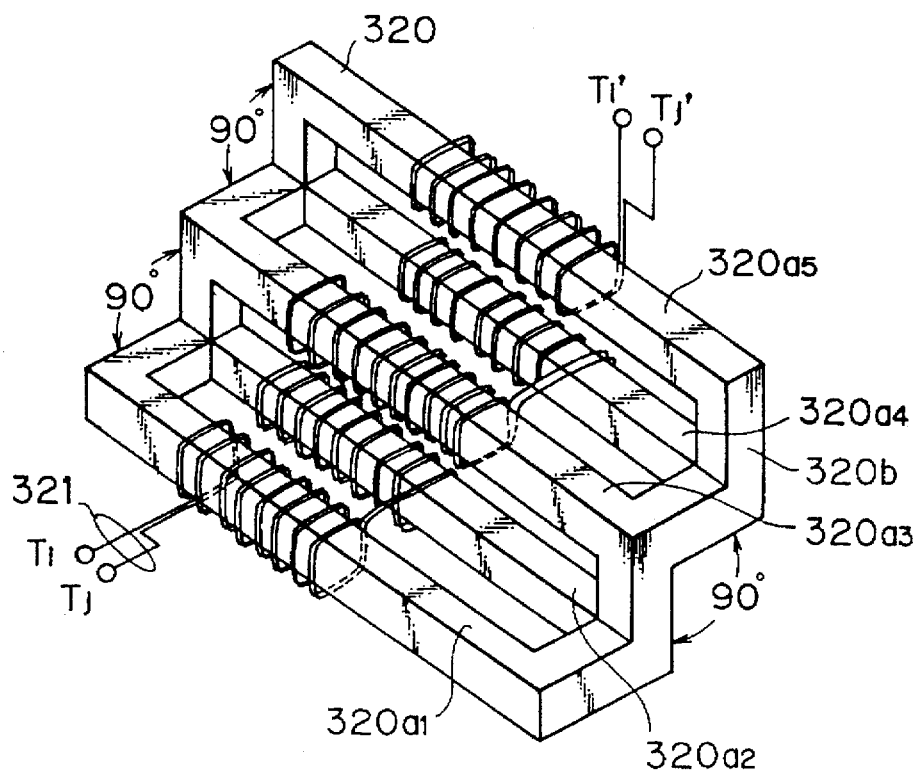
FIG. 32 shows an oblique view of a twentieth embodiment of an EMC filter according to the present invention.
Figure 33:
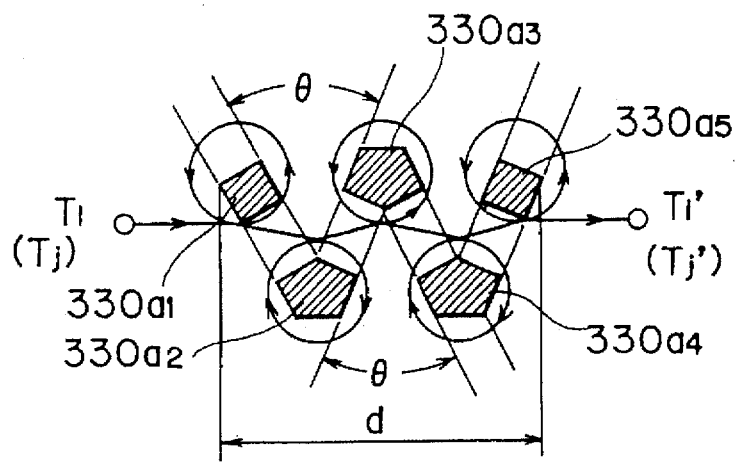
FIG. 33 shows a sectional view of a twenty-first embodiment of an EMC filter according to the present invention.

FIG. 32 shows an oblique view of a twentieth embodiment of an EMC filter according to the present invention. In this embodiment, a closed magnetic path core 320 with a (asymmetrical) solid shape consists of three corner core arms $320a_2$ $320a_3$ and $320a_4$ (first core arms), side core arms $320a_1$ and $320a_5$ (first core arms) in parallel with the corner core arms $320a_2$, $320a_3$ and $320a_4$, and second core arms 320b connected to both ends of the corner core arms $320a_2$, $320a_3$ and $320a_4$ and the side core arms $320a_1$ and $320a_5$ so as to provide four closed magnetic paths. A plane including the side core arm $320a_1$ and the corner core arm $320a_2$ intersects with a plane including the corner core arm $320a_2$ and the corner core arm $320a_3$ at right-angle. The plane including the corner core arm $320a_2$ and the corner core arm $320a_3$ intersects with a plane including the corner core arm $320a_3$ and the corner core arm $320a_4$ at right-angle. The plane including the corner core arm $320a_3$ and the corner core arm $320a_4$ intersects with a plane including the corner core arm $320a_4$ and the side core arm $320a_5$ at right-angle. Thus, the section of these four planes is W-shaped. Namely, this closed core 320 is formed by connecting two of the closed cores 310 of the embodiment of FIG. 31. Around the side core arm $320a_1$, the corner core arm $320a_2$, the corner core arm $320a_3$, the corner core arm $320a_4$, and the side core arms 320$a_5$, pairs of wires 321 are wound as well as the pair wires 311 in the nineteenth embodiment of FIG. 31. Other elements and advantages in this embodiment are the same as those in the nineteenth embodiment of FIG. 31. FIG. 33 shows a sectional view of a twenty-first embodiment of an EMC filter according the present invention. This embodiment has the same configuration and advantages as those of the twentieth embodiment of FIG. 32 except that a plane including the side core arm 330$a_1$ and the corner core arm 330$a_2$ intersects with a plane including the corner core arm 330$a_2$ and the corner core arm 330$a_3$ at an angle θ less than right-angle (90°), that the plane including the corner core arm 330$a_2$ and the corner core arm 330$a_3$ intersects with a plane including the corner core arm 330$a_3$ and the corner core arm 330$a_4$ at an angle θ less than right-angle (90°), and that the plane including the corner core arm 330$a_3$ and the corner core arm 330$a_4$ intersects with a plane including the corner core arm 330$a_4$ and the side core arm 330$a_5$ at an angle θ less than right-angle (90°). According to this structure of the closed magnetic path core 330, a length d of the EMC filter across the side core arms 330$a_1$ and 330$a_5$ can be reduced causing the filter to downsize and also its inductance against common-mode noise current can be increased causing its suppression capability for the common-mode noise currents to improve.

Figure 34:
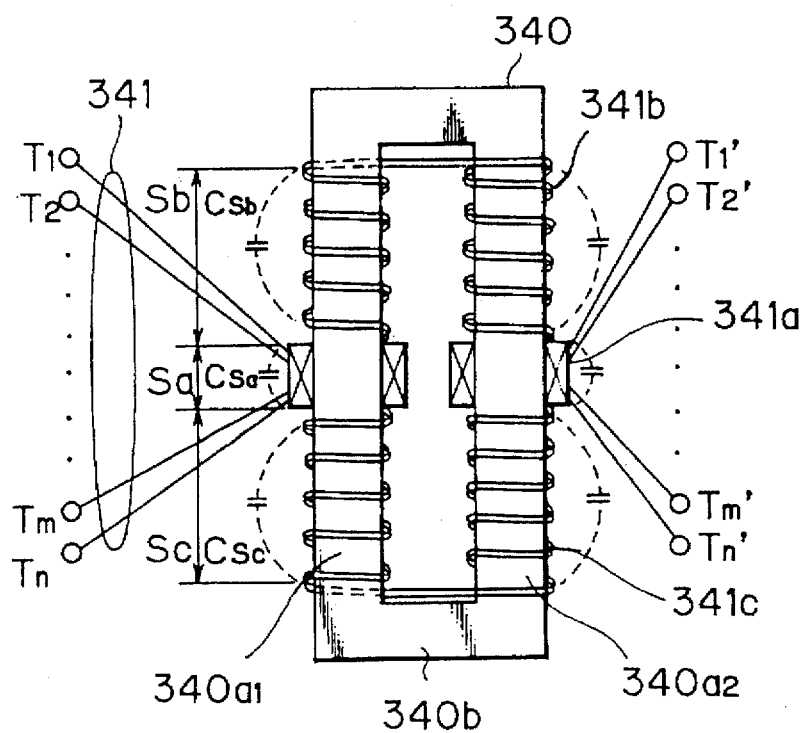
FIG. 34 shows a plane view of a twenty-second embodiment of an EMC filter according to the present invention.

FIG. 34 shows a plane view of a schematic structure of a twenty-second embodiment of an EMC filter according to the present invention.

In FIG. 34, a reference numeral 340 denotes a closed magnetic path core of a (symmetrical) rectangular loop with two parallel first core arms 340$a_1$ and 340$a_2$ and two parallel second core arms 340$b$. The first core arms 340$a_1$ and 340$a_2$ are longer than the second core arms 340$b$, and these first and second core arms 340$a_1$ and 340$a_2$ and 340$b$ form a closed magnetic path. The rectangular loop core 340 has an effective magnetic permeability μ which is substantially equal to that of the conventional toroidal core 10 shown in FIGS. 1$a$ and 1$b$.

Around the first core arms 340$a_1$ and 340$a_2$, one pair or more pairs of wires 341 are wound to form a plurality of coils which will be connected to respective wires of a balanced multi-wired telecommunication line (not shown). In FIG. 34 and in the following figures, only typical pair or pairs of coiled wires are illustrated for easily understanding the winding structure. These wires 341 are wound on the first core arms 340$a_1$ and 340$a_2$ in turning directions so as to produce magnetic fluxes in the closed core 340 flowing toward the same direction when a common-mode current flows through the wires.

Each of the first core arms 340$a_1$ and 340$a_2$ is separated into three sections, two first sections Sb and Sc and one second section Sa. In the first sections Sb and Sc positioned at both sides of the second section Sa, each pair of the wound wires 341$b$ and 341$c$ is distributed with a space between its neighbor windings. In the second section Sa positioned near a center of the first core arms 340$a_1$ and 340$a_2$, each pair of the wound wires 341$a$ is concentrated in a multi-layered form with no space between its neighbor windings. One half of pairs of wires are wound on one of the distributed winding section Sb of the first core arms 340$a_1$ and 340$a_2$ and the remaining half are wound on the other distributed winding sections Sc of the first core arms 340$a_1$ and 340$a_2$.

The coils have signal input ends (input terminals) $T_1$, $T_2$, ..., $T_m$, $T_n$ connected to the wires in the concentrated winding section Sa positioned near the center of the input side first core arm 340$a_1$ and signal output ends (output terminals) $T_1'$, $T_2'$, ..., $T_m'$, $T_n'$ connected to the wires in the concentrated winding section Sa near the center of the output side first core arm 340$a_2$. The wires run in a one-way direction from the signal input ends $T_1$, $T_2$, ..., $T_m$, $T_n$ at the input side first core arm 340$a_1$ to the signal output ends $T_1'$, $T_2'$, ..., $T_m'$, $T_n'$ at the output side first core arm 340$a_2$. Namely, each pair of the wires is started form the signal input ends $T_1$, $T_2$, ..., $T_m$, $T_n$, wound in concentrated fashion with no space between its neighbor windings along the input side first core arm 340$a_1$ toward one end of the core arm 340$a_1$, wound in distributed fashion with a space between its neighbor windings along the core arm 340$a_1$ toward the one end, introduced to the output side first core arm 340$a_2$ at the one end, wound in distributed fashion with a space between its neighbor windings along this core arm 340$a_2$ toward a center of this core arm 340$a_2$, wound in concentrated fashion with no space between its neighbor windings along the core arm 340$a_2$ toward the center of the core arm 340$a_2$, and arrived at the output ends $T_1'$, $T_2'$, ..., $T_m'$, $T_n'$.

The wires of each pair are closely positioned each other. Namely, in this embodiment, the wires of each pair are formed by a parallel pair wires contacted with each other.

When common-mode noise currents flow through the pair wound wires, since magnetic fluxes flow through the closed core 340 in the same direction, a total magnetic flux produced is increased. In fact, as magnetic fluxes due to another coils not shown in FIG. 34 are added, a total inductance will be increased to a very large value. As will be apparent from FIG. 34, since each pair of wires are wound in distributed in the sections Sb and Sc and also separately wound on the two first core arms 340$a_1$ and 340$a_2$, stray capacitance between its input ends and output ends (combined capacitance of $Cs_a$, $Cs_b$ and $Cs_c$) will be suppressed from increasing as a whole. As a result, even if the common-mode noise currents are high frequency currents, the large inductance will effectively act to suppress the noise currents from being introduced.

When normal-mode currents flow through the pair wound wires, magnetic fluxes flow through the first core arm 340$a_1$ and 340$a_2$ in the opposite directions with each other and have the same amount causing themselves to compensate each other. As a result, if the normal-mode currents flow, no leakage inductance will be produced with little insertion loss. Furthermore, according to this embodiment, since all the pairs of wires are symmetrical wound with respect to the centers of the first core arms 340$a_1$ and 340$a_2$, crosstalk can be effectively reduced. Other elements and advantages in this embodiment are the same as those in the first embodiment of FIG. 5.

Figure 35:
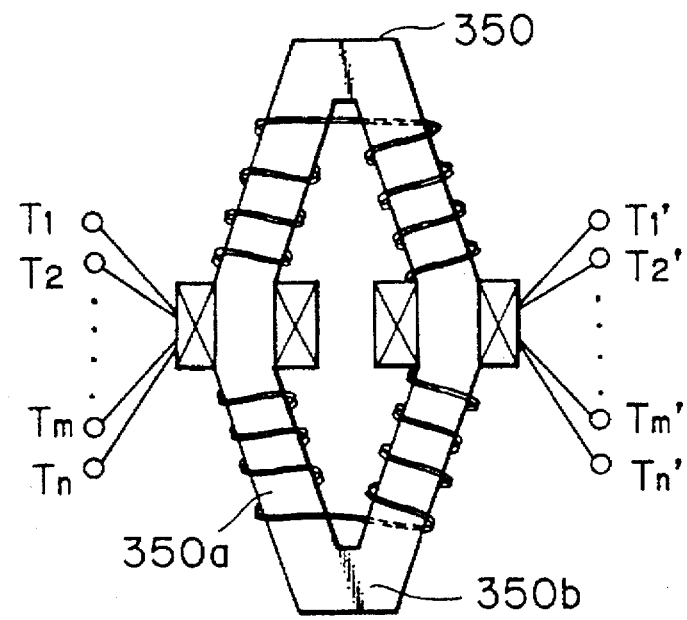
FIG. 35 shows a plane view of a twenty-third embodiment of an EMC filter according to the present invention.

FIG. 35 shows a plane view of a twenty-third embodiment of an EMC filter according the present invention. In this embodiment, a shape of a closed magnetic path core 350 is different from that of the core 340 in the embodiment of FIG. 34. Namely, the closed magnetic path core 350 consists of a (symmetrical) rhombus-like loop core. This loop is formed by connecting two first core arms 350$a$ and two second core arms 350$b$ which are shorter than the first core arms 350$a$, with each other. A distance between the two first core arms 350$a$ is the largest at centers of the arms 350$a$. Since there is a sufficient distance between the first core arms 350$a$ near there centers, a large number of turns of pair wires can be wound at this portion. Accordingly, the inductance can be effectively increased even if the core size is small. Other elements and advantages in this embodiment are the same as those in the embodiment of FIG. 34.

Figure 36:
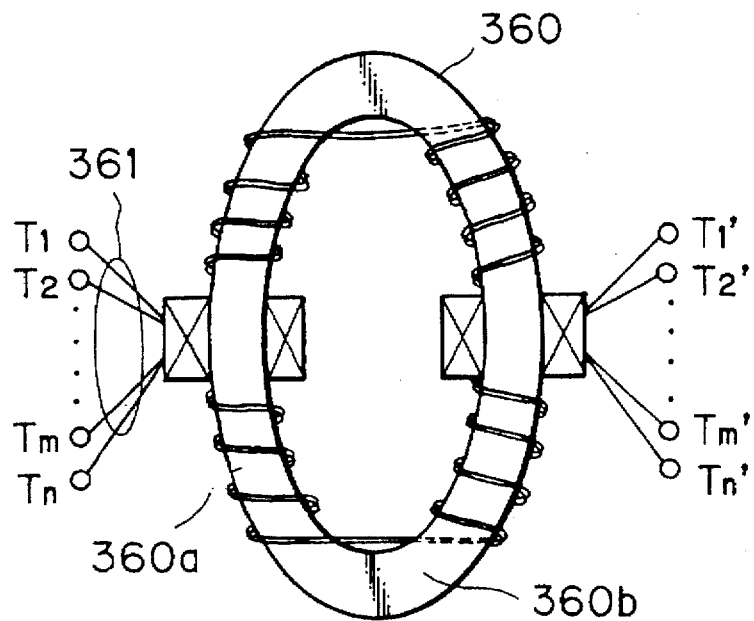
FIG. 36 shows a plane view of a twenty-fourth embodiment of an EMC filter according to the present invention.

FIG. 36 shows a plane view of a twenty-fourth embodiment of an EMC filter according to the present invention. In this embodiment, except that a closed magnetic path core 360 consists of an (symmetrical) oval loop core with two first core arms 360a and two second core arms 360b connected with each other, constitution such as pair wires 361 and advantages are the same as those in the embodiment of FIG. 35.

Figure 37:
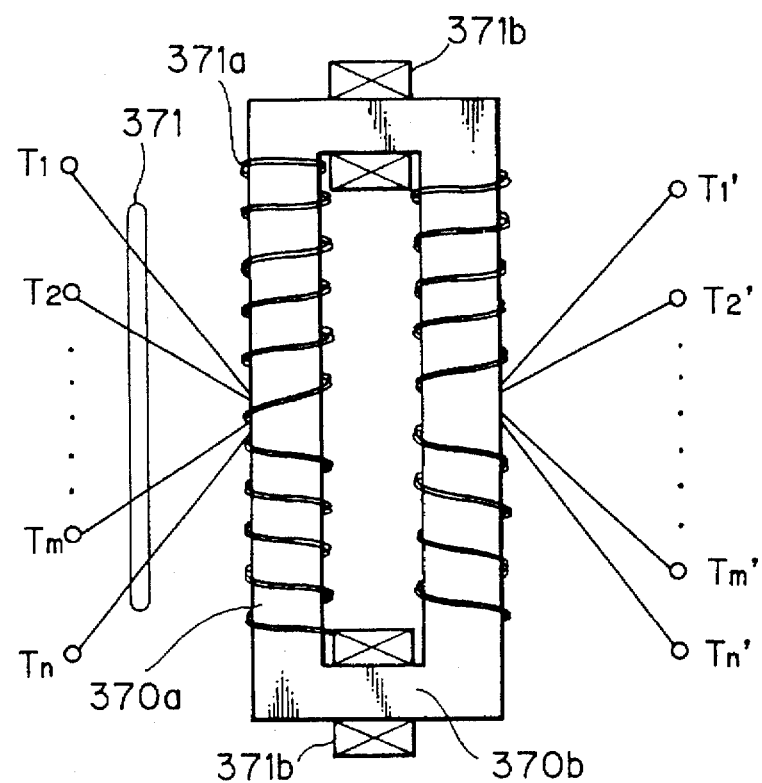
FIG. 37 shows a plane view of a twenty-fifth embodiment of an EMC filter according to the present invention.

FIG. 37 shows a plane view of a twenty-fifth embodiment of an EMC filter according to the present invention. In this embodiment, constitution of a closed magnetic path core 370 with two parallel first core arms 370a and two parallel second core arms 370b is the same as that of the core 340 in the twenty-second embodiment of FIG. 34. Also, constitution of each pair of wires 371 is the same as that of the pair wires 341 in the embodiment of FIG. 34. However, in this embodiment, each pair of the wires 371 is wound around the core 370 in different winding structure from that of the twenty-second embodiment. Namely, each pair of the wires 371a is wound so as to be distributed with a space between its neighbor windings along the whole length of each of first core arms 370a, and each pair of the wires 371b is wound around the second core arms 370b so as to be concentrated in a multi-layered form with no space between its neighbor windings. Since there is an enough distance between the second core arms 370b, a large number of turns of pair wires can be wound in a multi-layered form. Accordingly, the inductance can be effectively increased even if the core size is small. Also, since the length of the distributed winding section (first core arm) is enough longer than that of the concentrated winding section (a part of the second core arm), the total capacitance will be suppressed from increasing as a whole. As a result, even if the common-mode noise currents are high frequency currents, the very large inductance will effectively act to suppress the noise currents from being introduced. Other elements and advantages in this embodiment are the same as those in the twenty-second embodiment of FIG. 34.

Figure 38:
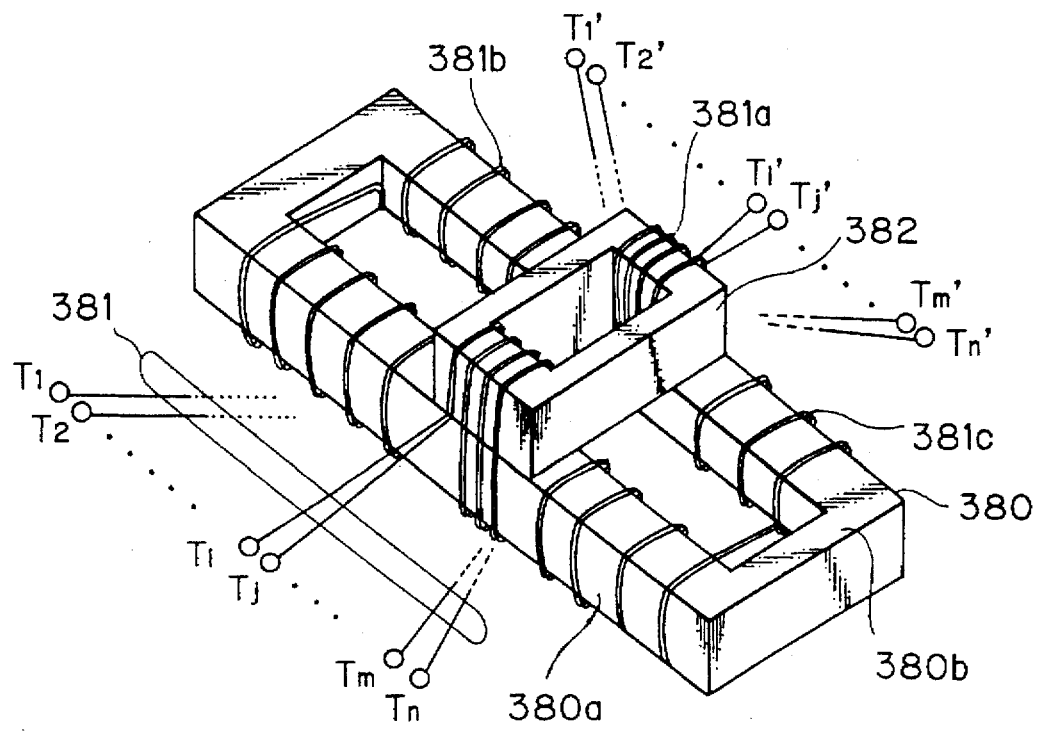
FIG. 38 shows an oblique view of a twenty-sixth embodiment of an EMC filter according to the present invention.

FIG. 38 shows an oblique view of a twenty-sixth embodiment of an EMC filter according to the present invention. In this embodiment, the configuration of a closed magnetic path core 380 with two parallel first core arms 380a and two parallel second core arms 380b is the same as that of the core 340 in the twenty-second embodiment of FIG. 34. Also, a winding structure of pair wires 381 wound in distributed winding sections (381b and 381c) and concentrated winding sections (381a) in the first core arms 380a is the same as that of the pair wires 341 in the twenty-second embodiment. However, in this embodiment, an additional closed magnetic path core 382 of a rectangular loop is laid across the centers (concentrated winding sections) of the two first core arms 380a, and the pair wires 381a in the concentrated winding sections are wound around the additional closed magnetic path core 382 in common with the first core arms 380a.

Since the total capacitance can be prevented from increasing in spite of a large stray capacitance at the commonly wound portion and also since a common-mode inductance at low frequency range can be increased to a necessary value by using the additional core 382 with an appropriate magnetic permeability, an excellent noise suppression capability against common-mode noise currents with high frequency component can be obtained over a wide frequency range as a whole. Other elements and advantages in this embodiment are the same as those in the twenty-second embodiment of FIG. 34.

Figure 39:
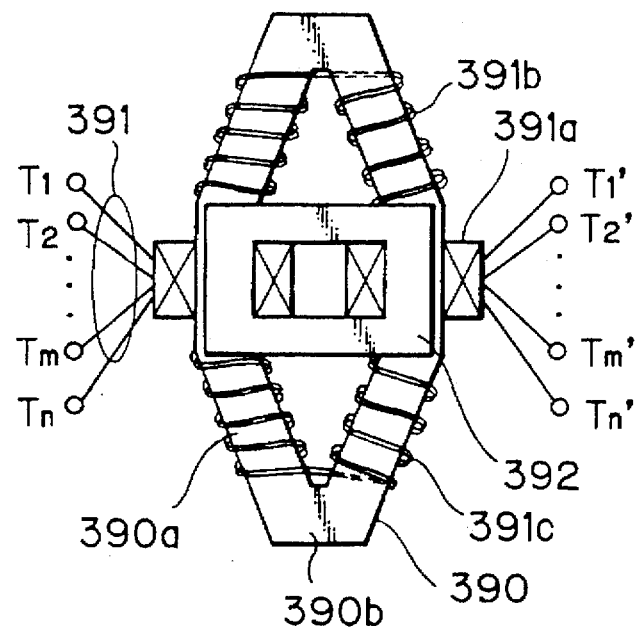
FIG. 39 shows a plane view of a twenty-seventh embodiment of an EMC filter according to the present invention.

FIG. 39 shows a plane view of a twenty-seventh embodiment of an EMC filter according to the present invention. In this embodiment, the configuration of a closed magnetic path core 390 with two first core arms 390a and two second core arms 390b is the same as that of the core 350 in the twenty-third embodiment of FIG. 35. Also, a winding structure of pair wires 391 wound in distributed winding sections (391b and 391c) and concentrated winding sections (391a) in the first core arms 390a is the same as that of the pair wires 351 in the twenty-third embodiment. However, in this embodiment, an additional closed magnetic path core 392 of a rectangular loop is laid across the centers (concentrated winding sections) of the two first core arms 390a, and the pair wires 391a in the concentrated winding sections are wound around the additional closed magnetic path core 392 in common with the first core arms 390a.

Since the total capacitance can be suppressed from increasing in spite of a large stray capacitance at the commonly wound portion and also since a common-mode inductance at low frequency range can be increased to a necessary value by using the additional core 392 with an appropriate magnetic permeability, an excellent noise suppression capability against common-mode noise currents with high frequency component can be obtained over a wide frequency range as a whole. Other elements and advantages in this embodiment are the same as those in the twenty-third embodiment of FIG. 35.

Figure 40:
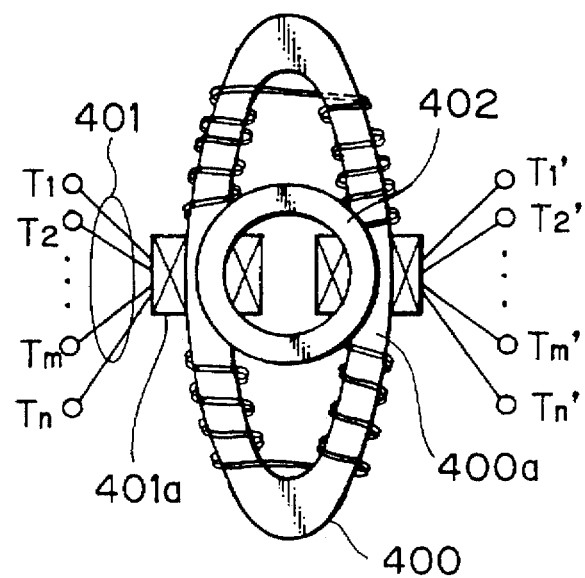
FIG. 40 shows a plane view of a twenty-eighth embodiment of an EMC filter according to the present invention.

FIG. 40 shows a plane view of a twenty-eighth embodiment of an EMC filter according to the present invention. In this embodiment, the configuration of a closed magnetic path core 400 of an oval loop is the same as that of the core 360 in the twenty-fourth embodiment of FIG. 36. Also, a winding structure of pair wires 401 is the same as that of the pair wires 361 in the twenty-fourth embodiment. A difference between the embodiments is that, in this embodiment, an additional closed magnetic path core 402 of a circular ring loop is laid across the centers (concentrated winding sections) of two first core arms 400a, and the pair wires 401a in the concentrated winding sections are wound around the additional closed magnetic path core 402 in common with the first core arms 400a.

Since the total capacitance can be prevented from increasing in spite of a large stray capacitance at the commonly wound portion and also since a common-mode inductance at low frequency range can be increased to a necessary value by using the additional core 402 with an appropriate magnetic permeability, an excellent noise suppression capability against common-mode noise currents with high frequency component can be obtained over a wide frequency range as a whole. Other elements and advantages in this embodiment are the same as those in the twenty-fourth embodiment of FIG. 36.

Figure 41:
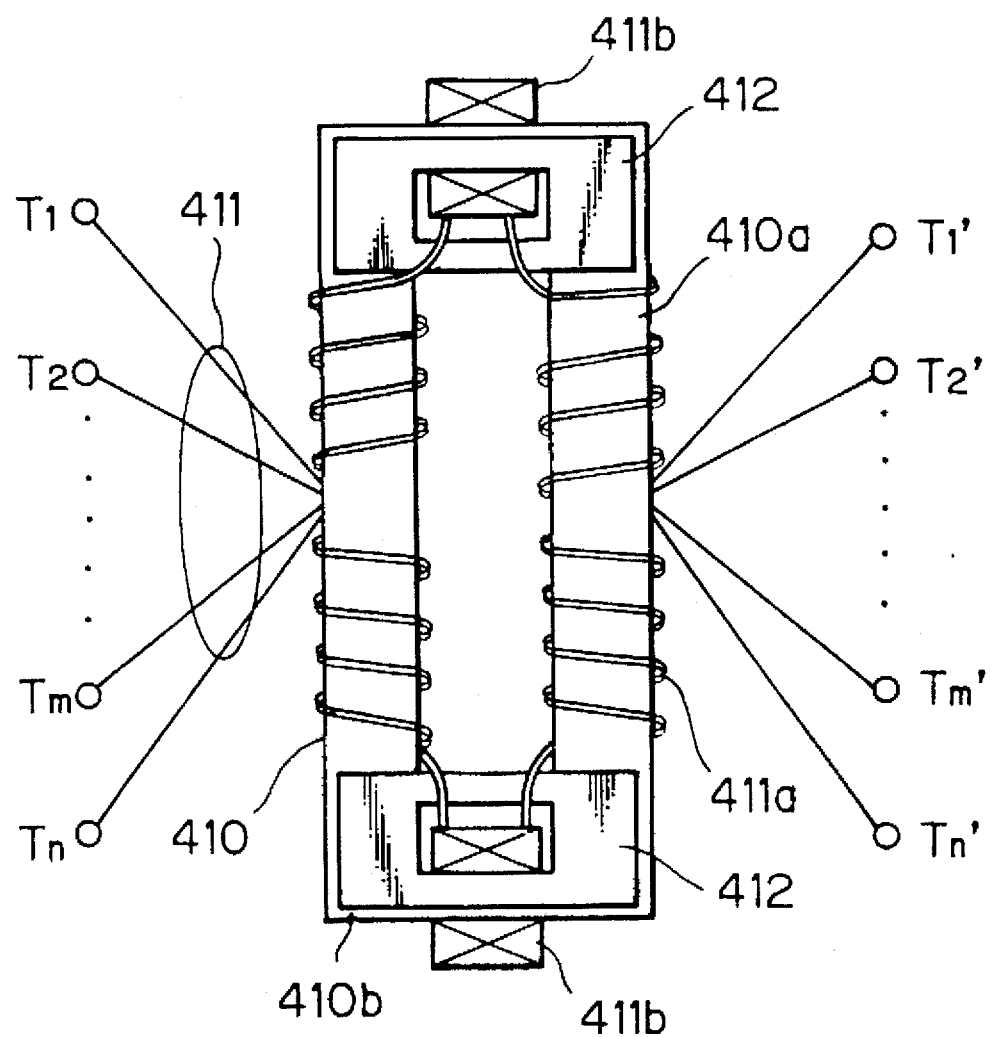
FIG. 41 shows a plane view of a twenty-ninth embodiment of an EMC filter according to the present invention.

FIG. 41 shows a plane view of a twenty-ninth embodiment of an EMC filter according to the present invention. In this embodiment, the configuration of a closed magnetic path core 410 with two first core arms 410a and two second core arms 410b is the same as that of the core 370 in the twenty-fifth embodiment of FIG. 37. Also, a winding structure of pair wires 411 wound in distributed (411a) around the first core arms 410a and in concentrated (411b) around the second core arms 410b is the same as that of the pair wires 371 in the twenty-fifth embodiment. However, in this embodiment, additional closed magnetic path cores 412 of a rectangular loop are laid across the side portions (concentrated winding sections) of the two first core arms 410a, and the pair wires 411a in concentrated are wound around the additional closed magnetic path cores 412 in common with the second core arms 410b.

Since the total capacitance can be prevented from increasing in spite of a large stray capacitance at the commonly wound portion and also since a common-mode inductance at low frequency range can be increased to a necessary value by using the additional cores 412 with an appropriate magnetic permeability, an excellent noise suppression capability against common-mode noise currents with high frequency component can be obtained over a wide frequency range as a whole. Other elements and advantages in this embodiment are the same as those in the twenty-fifth embodiment of FIG. 37.

As mentioned hereinbefore, an EMC filter according to the present invention has an excellent suppressing characteristics against various high frequency common-mode noise currents under non-grounded state, a small transmission loss against information signals (differential-mode or normal-mode currents), and a small crosstalk between pair wires in a multi-wired telecommunication line.

Figure 1A:
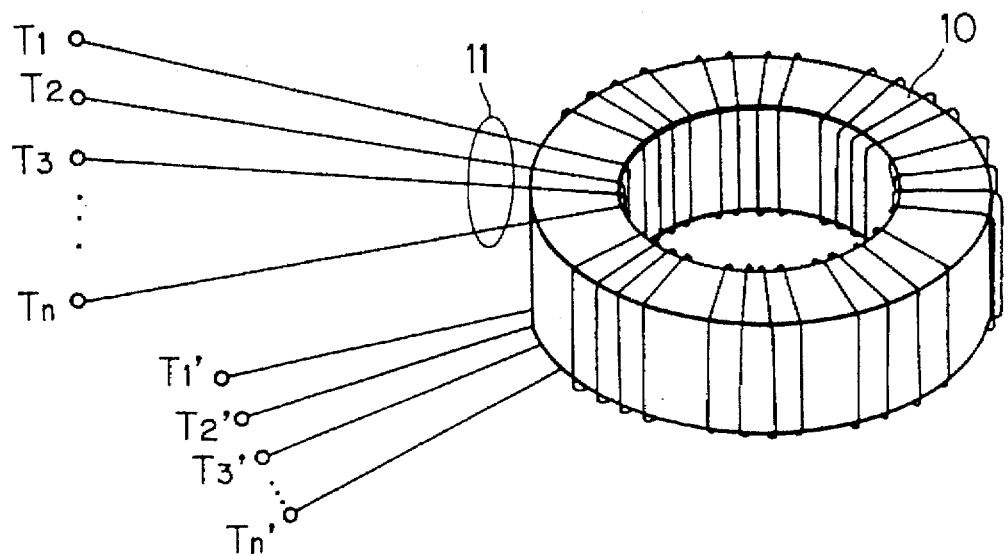
FIGS. 1a and 1b show an oblique view and a sectional view of the already mentioned schematic structure of a conventional choke coil filter using a toroidal core; mentioned electrical equivalent circuits of the toroidal core.
Figure 1B:
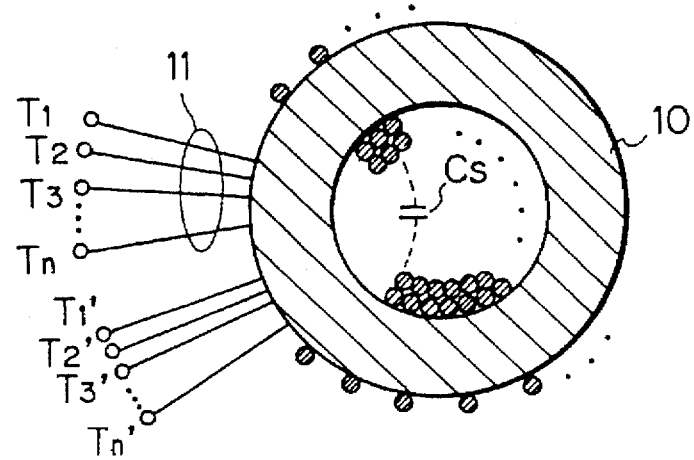
Figure 2A:
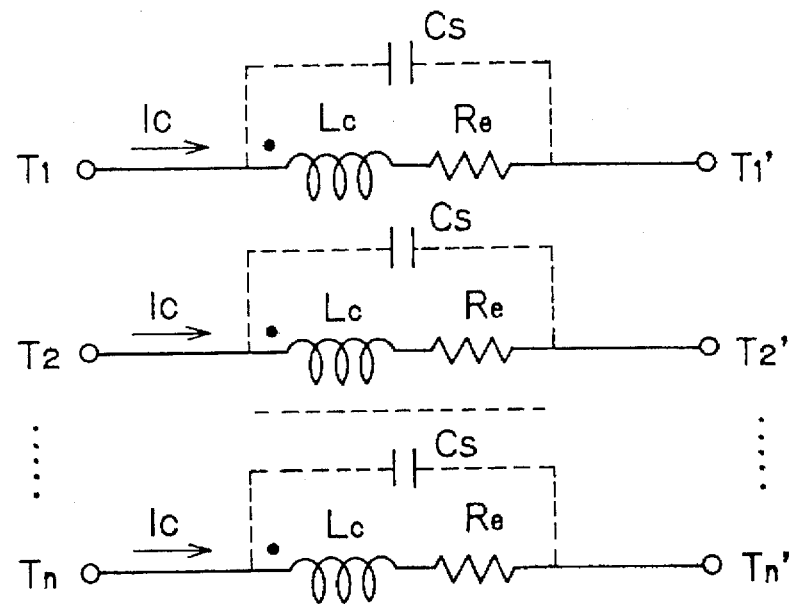
FIGS. 2a and 2b show circuit diagrams of the already choke coil shown in FIGS. 1a and 1b.
Figure 2B:
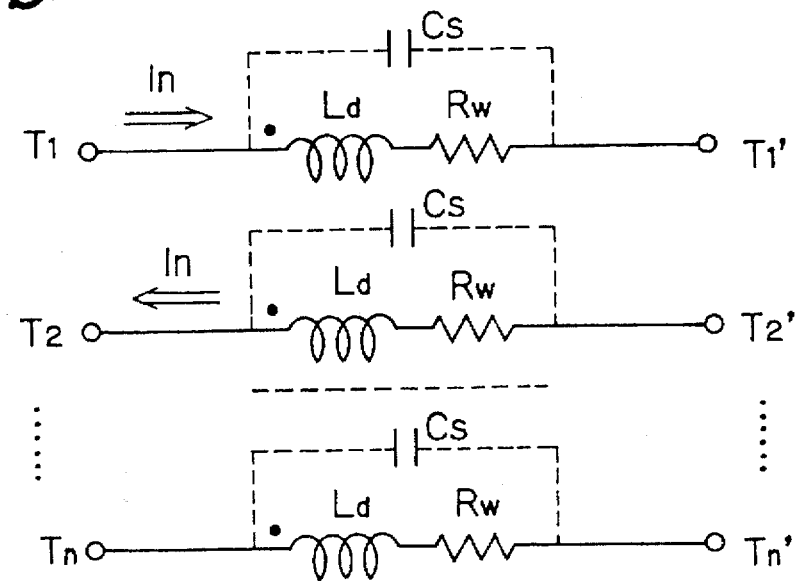
Figure 3:
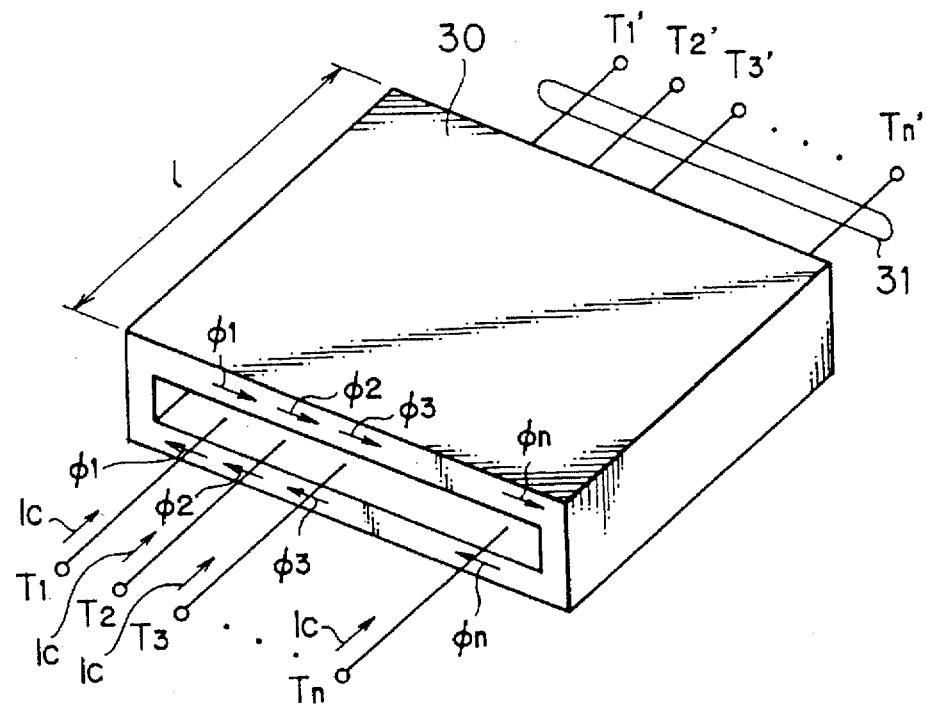
FIG. 3 shows an oblique view of the already mentioned schematic structure of a conventional choke coil filter with a plane passing through core.
Figure 4:
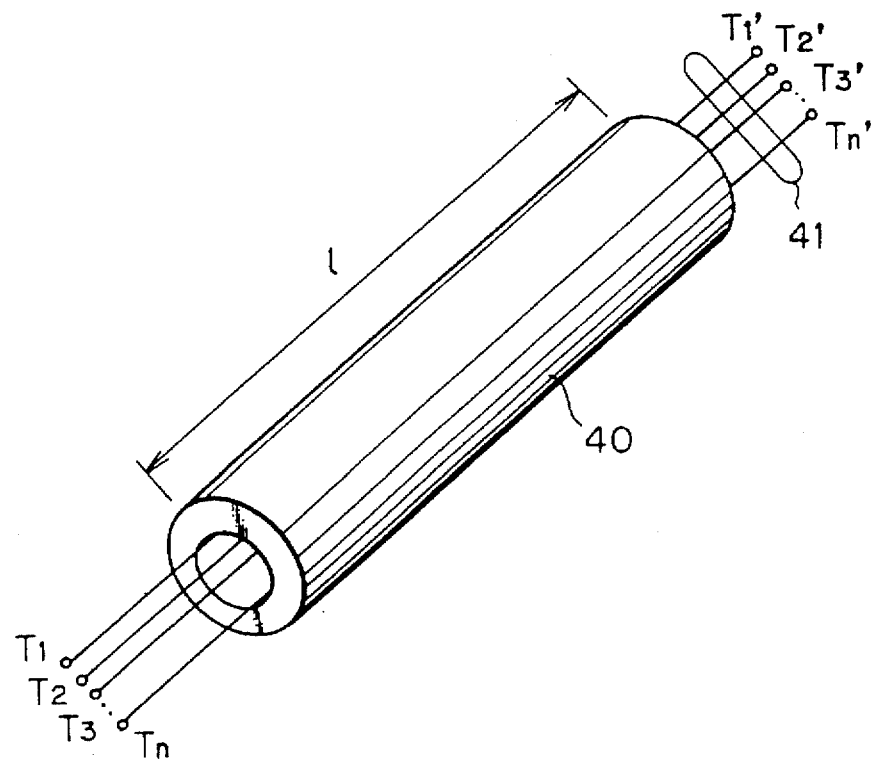
FIG. 4 shows an oblique view of already mentioned schematic structure of a conventional choke coil filter with a cylindrical passing through core.
Figure 42:
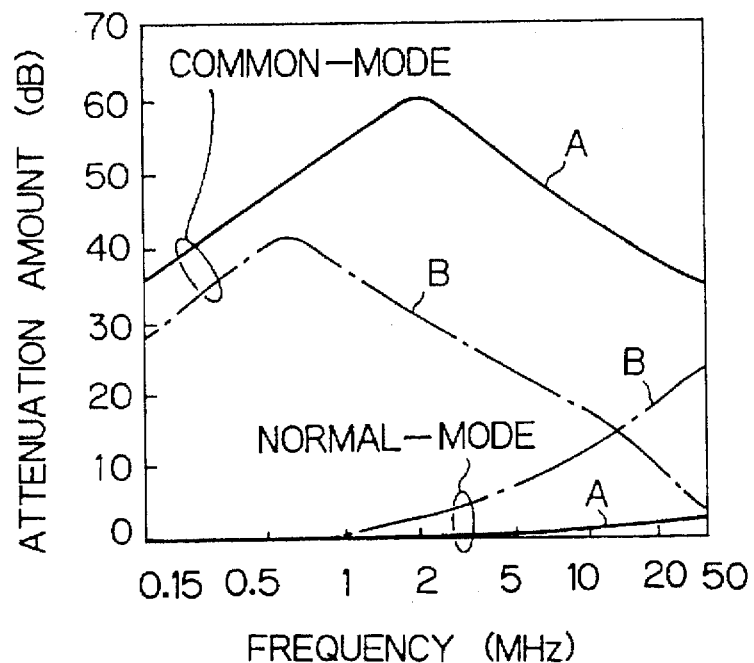
FIG. 42 illustrate common-mode noise currents and normal-mode currents attenuation characteristics.

FIG. 42 illustrates common-mode noise currents and normal-mode currents attenuation characteristics of an EMC filter having a structure constituted by somewhat modifying the EMC filter of the first embodiment shown in FIG. 5 such that twisted pair wires are used instead of parallel pair wires (denoted by A), in comparison with the characteristics of a conventional EMC filter using a ring type toroidal core shown in FIGS. 1a and 1b (denoted by B). As will be apparent from this figure, the EMC filter according to the invention has an excellent suppressing characteristics against high frequency common-mode noise currents and also has a very small transmission loss against the normal-mode currents.

Figure 43:
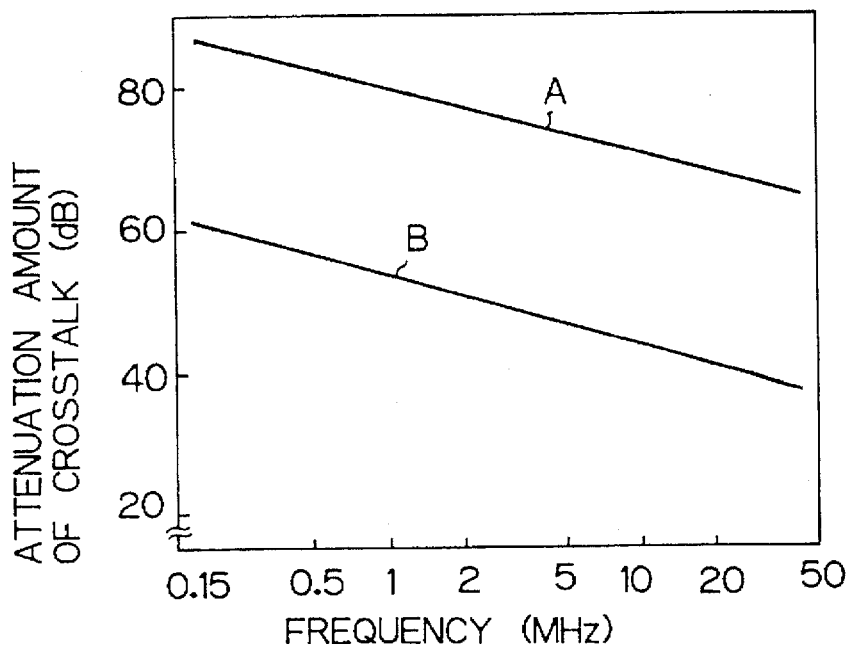
FIG. 43 illustrate cross talk attenuation characteristics.

FIG. 43 illustrates crosstalk attenuation characteristics of an EMC filter having a structure constituted by somewhat modifying the EMC filter of the first embodiment shown in FIG. 5 such that twisted pair wires are used instead of parallel pair wires (denoted by A), in comparison with the characteristics of a conventional EMC filter using a ring type toroidal core shown in FIGS. 1a and 1b (denoted by B). As will be apparent from this figure, the EMC filter according to the invention has an excellent suppression characteristics against crosstalk.

If all the twisted pair wires of the balanced multi-wired telecommunication line are further twisted, since there occurs no unbalance between the pairs, the crosstalk suppression characteristics will be further improved.

It will be understood that an EMC filter according to the present invention can be configured by combining and modifying parts of the aforementioned various specific embodiments.

Hereinafter, various applications of the aforementioned EMC filter according to the present invention will be described in detail.

Figure 44:
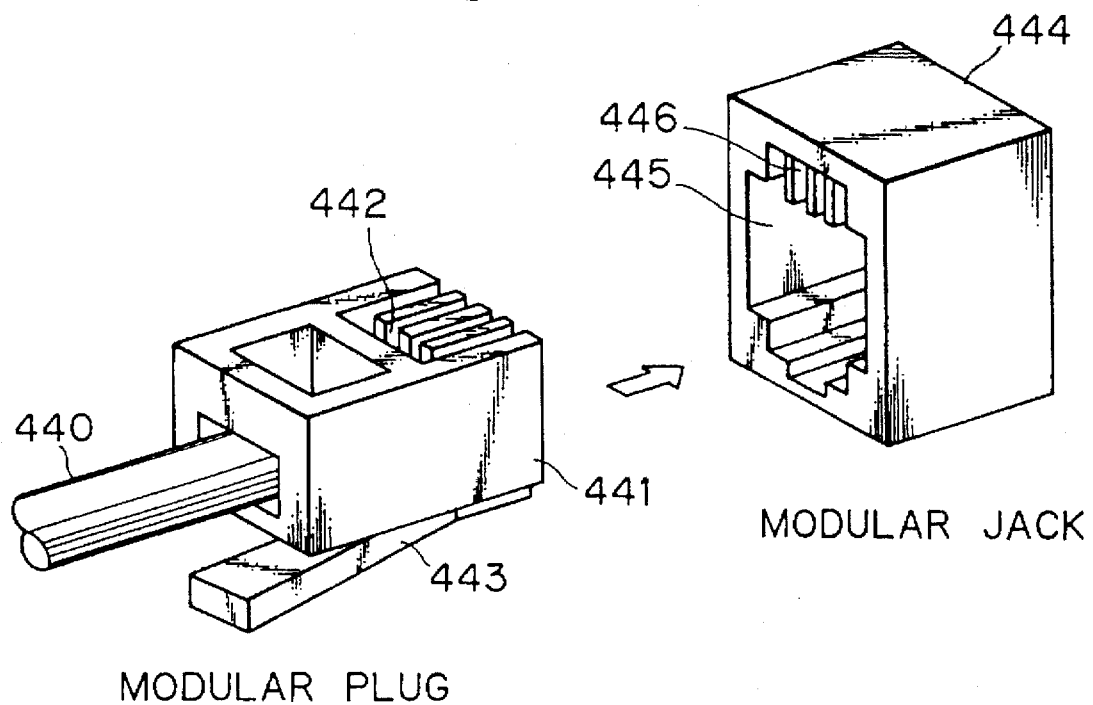
FIG. 44 shows an external oblique view of a conventional modular plug and a conventional modular jack.

FIG. 44 shows an external oblique view of a conventional modular plug and a conventional modular jack. As shown in this figure, the modular plug connected to a multi-paired telecommunication line 440 has a plug housing 441, plug contact slots 442 and a locking bar 443, and the modular jack has a jack housing 444, an opening 445 for receiving the modular plug and spring contact slots 446 which will meet with the plug contact slots 442 when the modular plug is connected.

Figure 45:
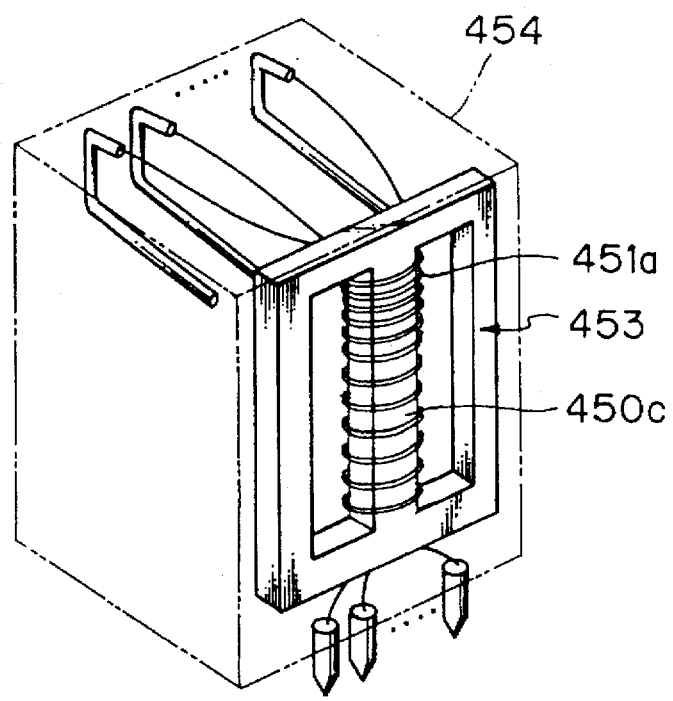
FIG. 45 shows an oblique view of a first example of applications of the EMC filter according to the present invention.

FIG. 45 shows an oblique view of a first example of applications of the EMC filter according to the present invention. In this example, an EMC filter 453 is assembled in a housing 454 of a modular jack for connecting a balanced multi-wired telecommunication line such as ISDN, standard home bus, digital bus, analog telecommunication line, or TR cord. The modular jack housing 454 is similar to the housing 444 shown in FIG. 44 except that there is an inner space for mounting the EMC filter 453. Namely, the EMC filter 453 is mounted, in the housing 454 of the modular jack, at its rear side (opposite side to its opening for receiving a modular plug). EMC filter 453 itself has a structure constituted by somewhat modifying the EMC filter of the sixth embodiment shown in FIG. 16 such that concentrated wound pair wires 451a are positioned at one end portion of its center core arm 450c. Since the EMC filter 453 is positioned at the rear side of the modular jack, height and width of the housing 454 can be prevented from increasing.

Figure 46:
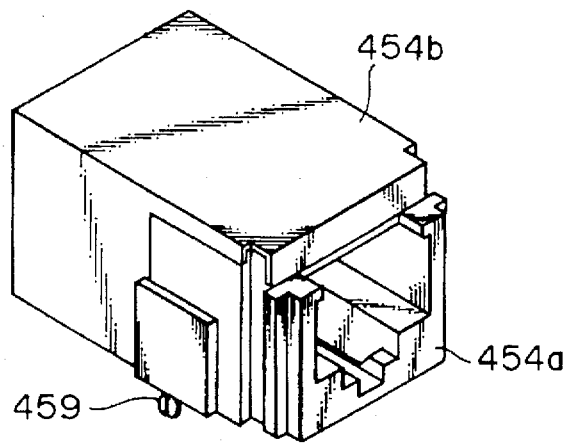
FIGS. 46a and 46b shown an oblique view and an exploded oblique view illustrating the first example of FIG. 45.
Figure 46:
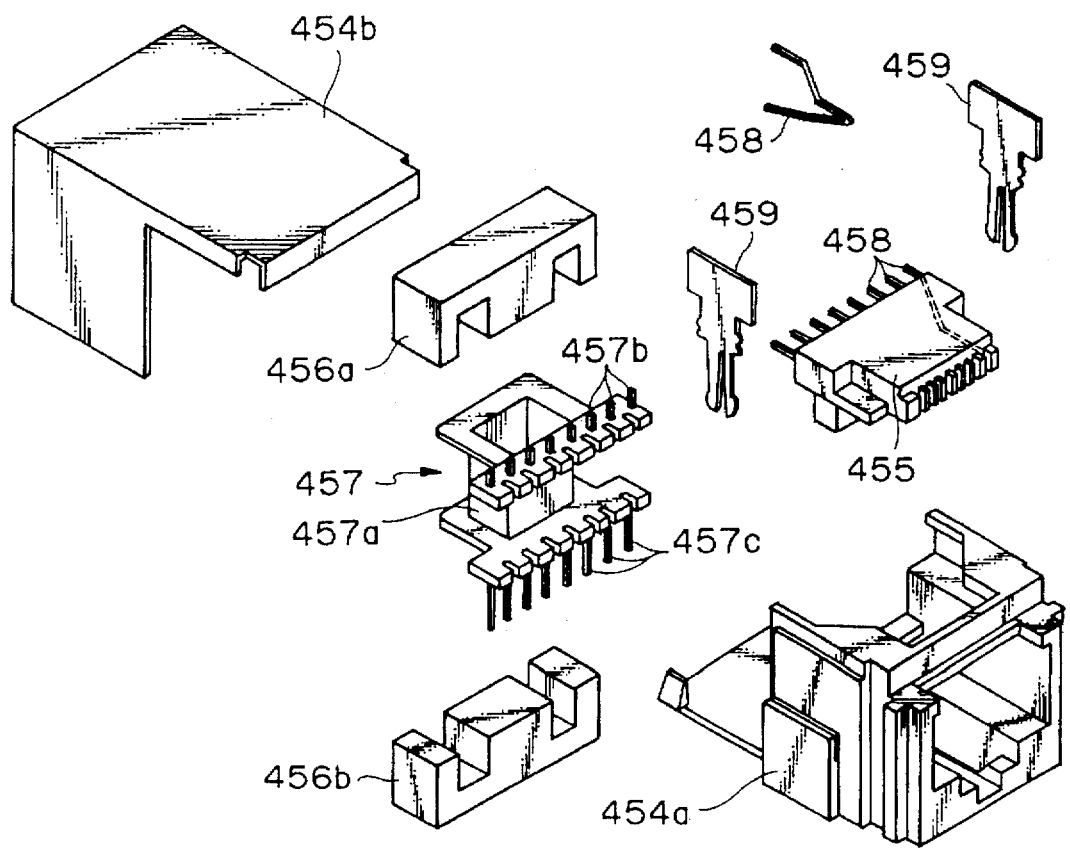

FIGS. 46a and 46b show an oblique view and an exploded oblique view illustrating the first example of FIG. 45. As shown in these figures, the modular jack of this example has a housing base 454a and a housing cover 454b. On the housing base 454a, spring terminal assembly 455 and an EMC filter consisting of separated cores 456a and 456b, a coil bobbin 457, and wound coils (not shown) are assembled. The spring terminal assembly 455 has spring terminals 458 of the number same as that of wires of a multi-wired telecommunication line to be connected. The coil bobbin 457 has a coil winding section 457a, spring terminal connection terminals 457b, and printed wiring board connection terminals 457c. Both ends of each coiled wire (not shown) are electrically connected to the terminals 457b and 457c, respectively. The terminals 457b are electrically connected, respectively, to the spring terminals 458. In assembling the modular jack, the spring terminal assembly 455 is first assembled in the housing base 454a, then the EMC filter 453 electrically connected to the spring terminals 458 is assembled at the rear side of the housing. Then, the housing cover 454b is fitted, and fixing pins 459 for fixing the modular jack to a printed wiring board for example are then attached.

Figure 47:
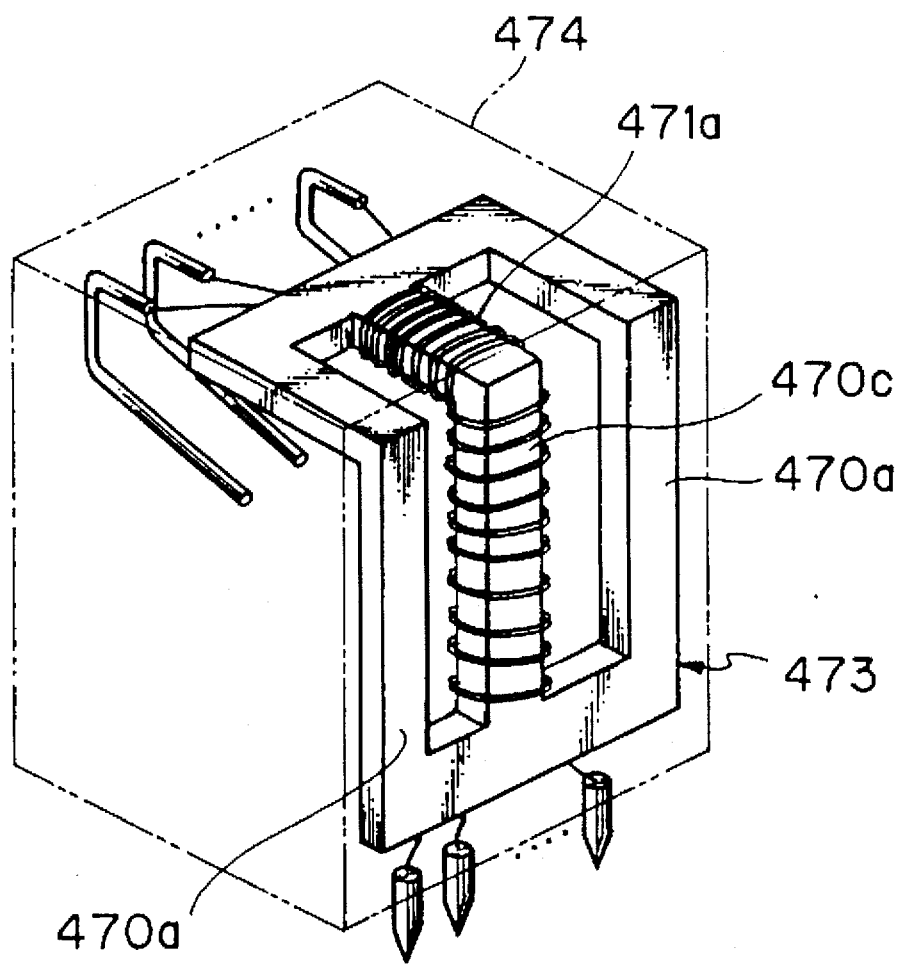
FIG. 47 shows an oblique view of a second example of applications of the EMC filter according to the present invention.

FIG. 47 shows an oblique view of a second example of applications of the EMC filter according to the present invention. In this example, an EMC filter 473 is assembled in a modular jack housing 474 which is similar to the housing 454 shown in FIG. 45 except for its top portion also has a space for mounting the EMC filter 473. Namely, the EMC filter 473 is mounted, in the housing 474, at its rear side (opposite side to its opening for receiving a modular plug) and at its top side. The EMC filter 473 has a structure constituted by somewhat modifying the EMC filter of the sixth embodiment shown in FIG. 16 as that a center core arm 470c and side core arms 470a are bent to have an L-shaped section and also concentrated wound pair wires 471a are positioned at the bent section of the center core arm 470c.

Figure 48:
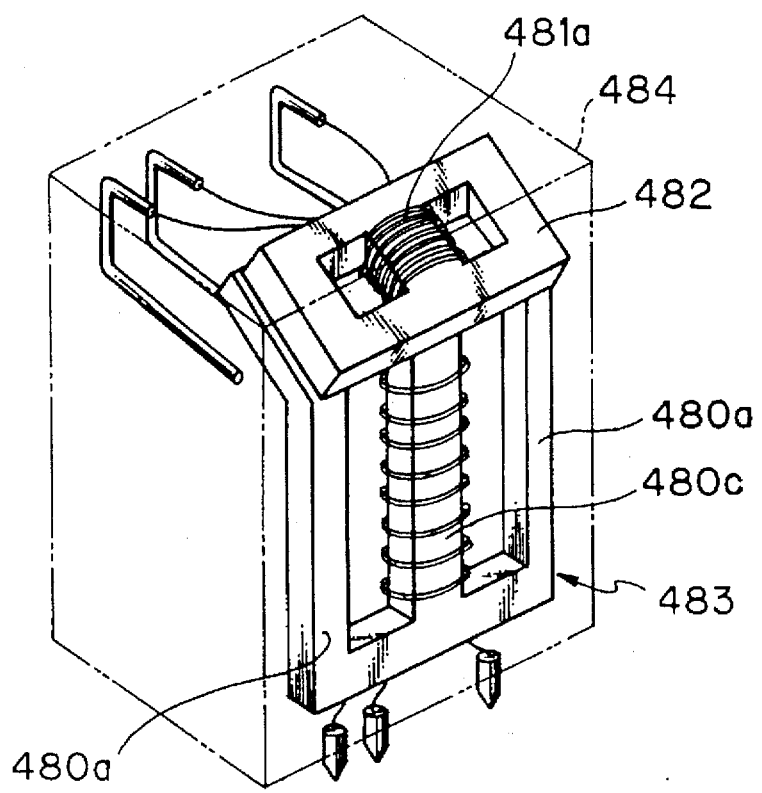
FIGS. 48a and 48b show an oblique view of a third example of applications of the EMC filter according to the present invention.
Figure 48:
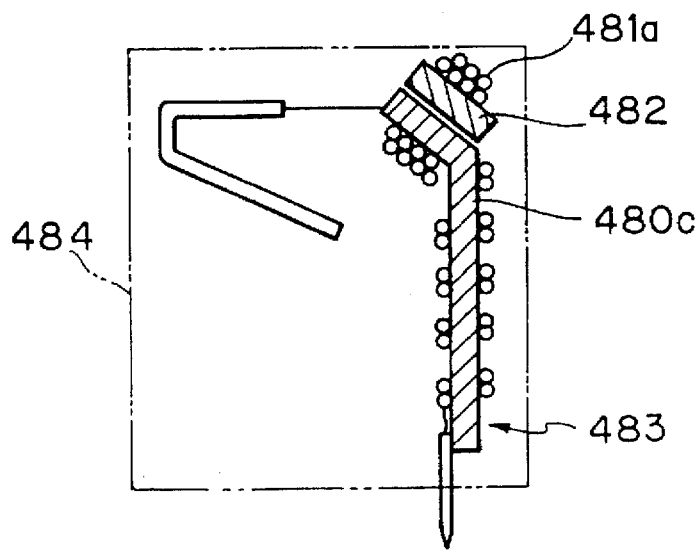

FIGS. 48a and 48b show an oblique view and a sectional view of a third example of applications of the EMC filter according to the present invention. In this example, an EMC filter 483 is assembled in a modular jack housing 484 which is similar to the housing 454 shown in FIG. 45. Namely, the EMC filter 483 is mounted, in the housing 484, at its rear side (opposite side of its opening for receiving a modular plug) and at its rear top corner. This EMC filter 483 itself has a structure formed by somewhat modifying the EMC filter of the eleventh embodiment shown in FIG. 21 as that a center core arm 480c and side core arms 480a are bent to have an L-shaped section and concentrated wound pair wires 481a and an additional closed magnetic path core 482 are positioned at the bent section of the center core arm 480c. Since a part of the EMC filter 483 is positioned at the rear top corner of the modular jack, dead space can be effectively utilized, thereby minimizing the required size of the housing 484.

Figure 49:
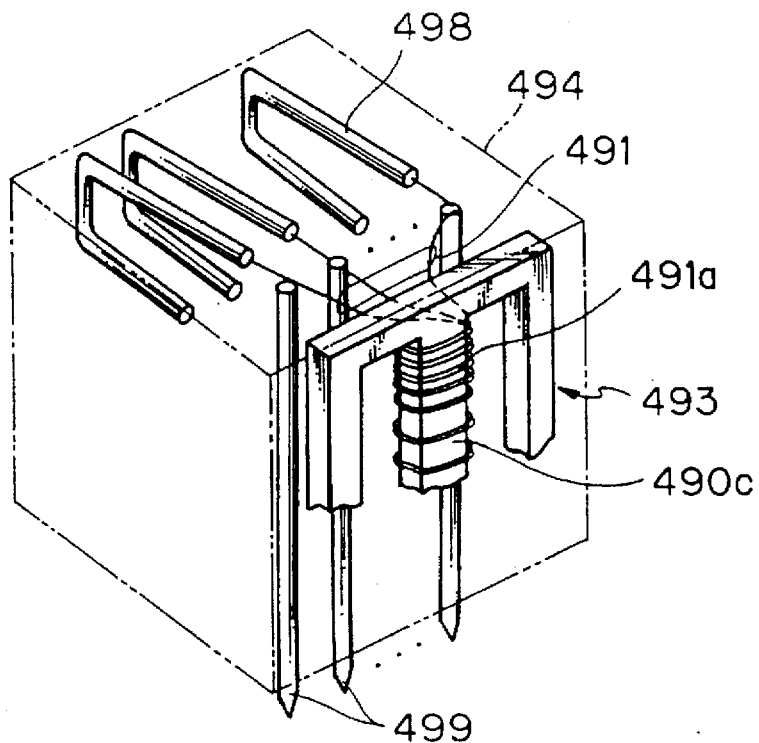
FIGS. 49a and 49b show an oblique view and a sectional view of a fourth example of applications of the EMC filter according to the present invention.
Figure 49:
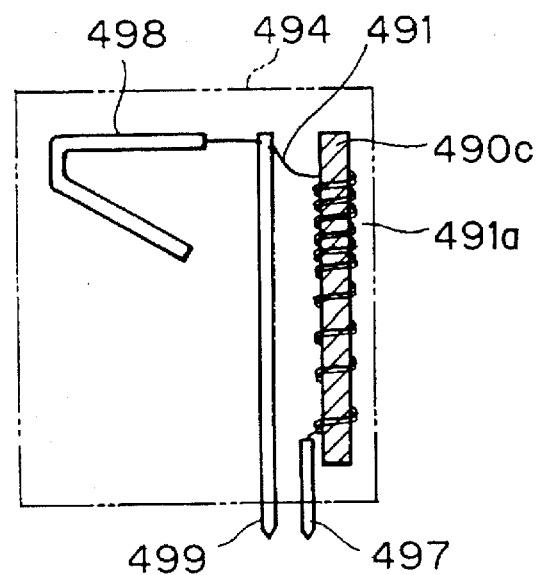

FIGS. 49a and 49b show an oblique view and a sectional view of a fourth example of applications of the EMC filter according to the present invention. In this example, an EMC filter 493 is assembled in a housing 494 of a modular jack which is similar to the modular jack shown in FIG. 45 except that this modular jack additionally has surge bypass terminals 499, in a number which is the same as the number of wires of a multi-wired telecommunication line to be connected.

The surge bypass terminals 499 as well as one ends of the coiled pair wires 491 of the EMC filter 493 are electrically connected to spring terminals 498, respectively. The other ends of the coiled pair wires 491 are connected to printed wiring board connection terminals 497 which will be connected to input terminals of a printed wiring board (not shown). The surge bypass terminals 499 will be connected to not shown surge absorption elements such as varistors mounted on the printed wiring board. Thus, high frequency common-mode noise currents introduced via the spring terminals 498 are suppressed by the EMC filter 493, and surge currents introduced via the spring terminals 498 are bypassed through the surge bypass terminals 499 without being applied to the EMC filter 493 protecting this EMC filter 493 from broken. In some cases, the surge bypass terminals 499 may be provided for only a part of the spring terminals 491 which are necessary to protect from surge currents, but not all of spring terminals 491, thereby enabling the size of the modular jack housing to be reduced.

The EMC filter 493 itself, which is mounted, in this housing 494, at its rear side (opposite side of its opening for receiving a modular plug), has a structure which is formed by somewhat modifying the EMC filter of the sixth embodiment shown in FIG. 16 as that concentrated wound pair wires 491a are positioned at one end portion of its center core arm 490c.

Figure 50:
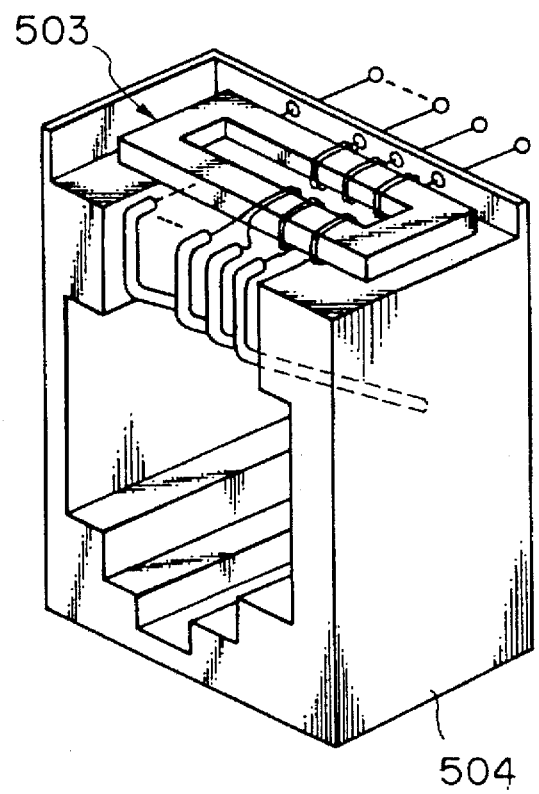
FIG. 50 shows an oblique view, with a portion broken away to reveal the EMC filter, of a fifth example of applications of the EMC filter according to the present invention.

FIG. 50 shows an oblique view, with a portion broken away to reveal the EMC filter, of a fifth example of applications of the EMC filter according to the present invention. In this example, an EMC filter 503 is assembled in a modular jack housing 504 which is similar to the housing 454 shown in FIG. 45 except that its inner top portion has a space for mounting the EMC filter 503. Namely, the EMC filter 503 is mounted, in the housing 504, at its top side. The EMC filter 503 itself has the same structure as the EMC filter of the fifteenth embodiment shown in FIGS. 25a and 25b.

Figure 51:
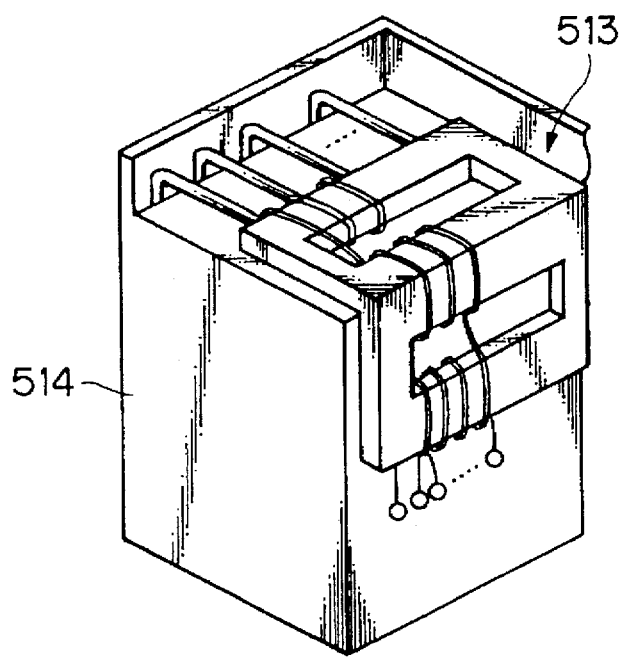
FIG. 51 shows an oblique view, with a portion broken away to reveal the EMC filter, of a sixth example of applications of the EMC filter according to the present invention.

FIG. 51 shows an oblique view, with a portion broken away to reveal the EMC filter, of a sixth example of applications of the EMC filter according to the present invention. In this example, an EMC filter 513 is assembled in a modular jack housing 514 which is similar to the housing 454 shown in FIG. 45 except that its inner top portion and its rear side portion have a space for mounting the EMC filter 513. Namely, the EMC filter 513 is mounted, in the housing 514, at its rear side (opposite side to its opening for receiving a modular plug) and its top side. The EMC filter 513 has the same structure as the EMC filter, with a L-shaped section, of the nineteenth embodiment shown in FIG. 31.

Figure 52:
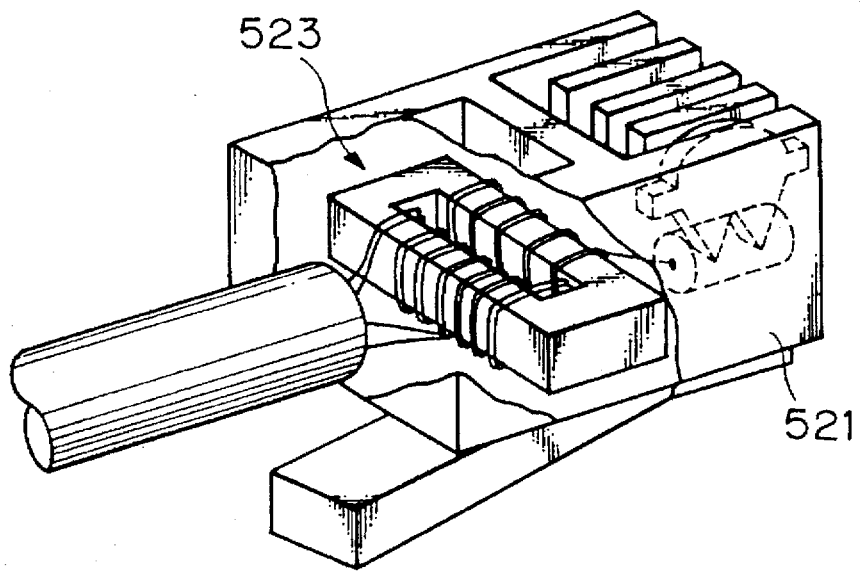
FIG. 52 shows an oblique view, with a portion broken away to reveal the EMC filter, of a seventh example of applications of the EMC filter according to the present invention.

FIG. 52 shows an oblique view, with a portion broken away to reveal the EMC filter, of a seventh example of applications of the EMC filter according to the present invention. In this example, an EMC filter 523 is assembled in a modular plug housing 521 which is similar to the housing 441 shown in FIG. 44 except that there is an inner space for mounting the EMC filter 523. The EMC filter 523 itself has the same structure as the EMC filter of the fifteenth embodiment shown in FIGS. 25a and 25b.

Figure 53:
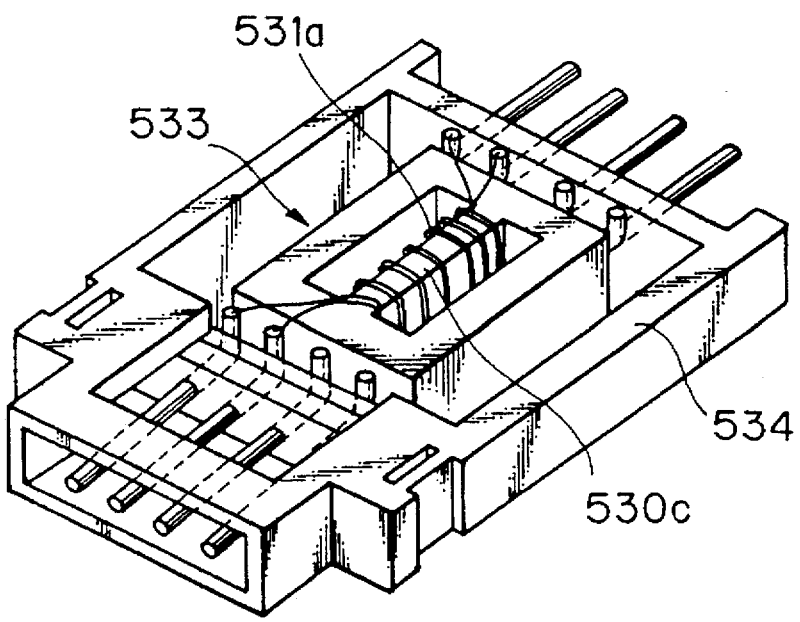
FIG. 53 shows an oblique view, with a portion broken away to reveal the EMC filter, of an eighth example of applications of the EMC filter according to the present invention.

FIG. 53 shows an oblique view, with a portion broken away to reveal the EMC filter, of an eighth example of applications of the EMC filter according to the present invention. In this example, an EMC filter 533 is assembled in a housing 534 of a flat connector for connecting a balanced multi-wired (four-wires in this example) telecommunication line (non-grounded) such as RS-232D. The EMC filter 533 itself has a structure constituted by somewhat modifying the EMC filter of the sixth embodiment shown in FIG. 16 such that concentrated wound pair wires 531a are positioned at one end portion of its center core arm 530c.

Figure 54:
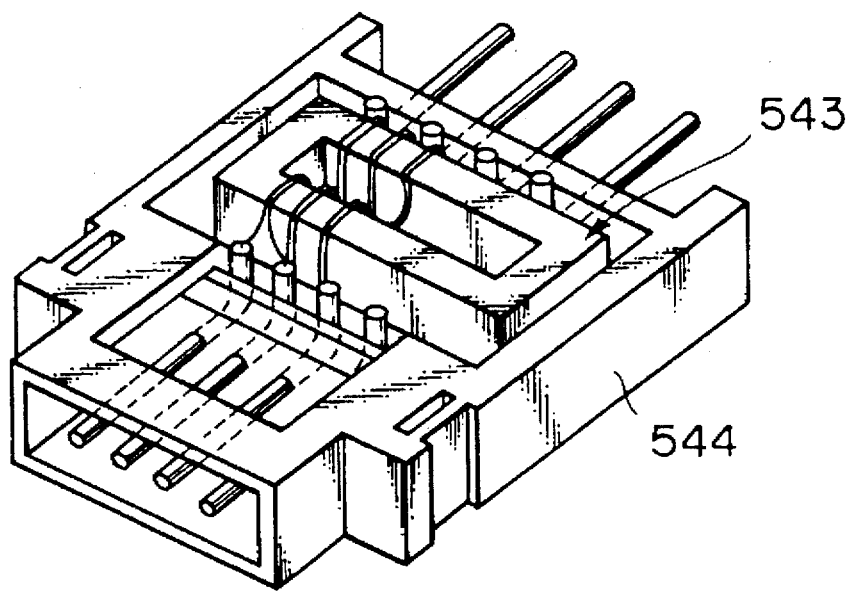
FIG. 54 shows an oblique view, with a portion broken away to reveal the EMC filter, of a ninth example of applications of the EMC filter according to the present invention.

FIG. 54 shows an oblique view, with a portion broken away to reveal the EMC filter, of a ninth example of applications of the EMC filter according to the present invention. In this example, an EMC filter 543 is assembled in a housing 544 of a flat connector for connecting a balanced multi-wired (four-wires in this example) telecommunication line (non-grounded) such as the EMC filter of the fifteenth embodiment shown in FIGS. 25a and 25b.

Figure 55:
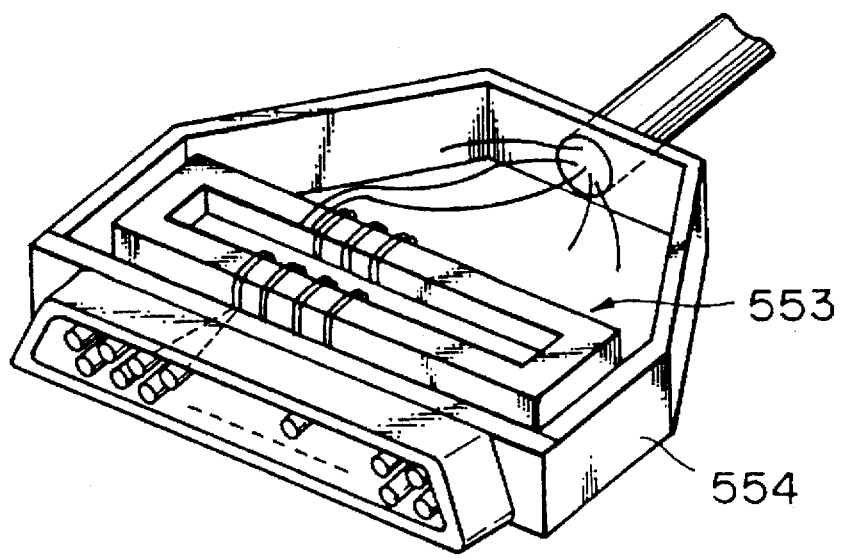
FIG. 55 shows an oblique view, with a portion broken away to reveal the EMC filter, of a tenth example of applications of the EMC filter according to the present invention.

FIG. 55 shows an oblique view, with a portion broken away to reveal the EMC filter, of a tenth example of applications of the EMC filter according to the present invention. In this example, an EMC filter 553 is assembled in a housing 554 of a D-type sub-connector for connecting a balanced multi-wired interface cable (non-grounded) such as RS-232C or GP-IB. The EMC filter 553 itself has the same structure as the EMC filter of the fifteenth embodiment shown in FIGS. 25a and 25b.

Figure 56:
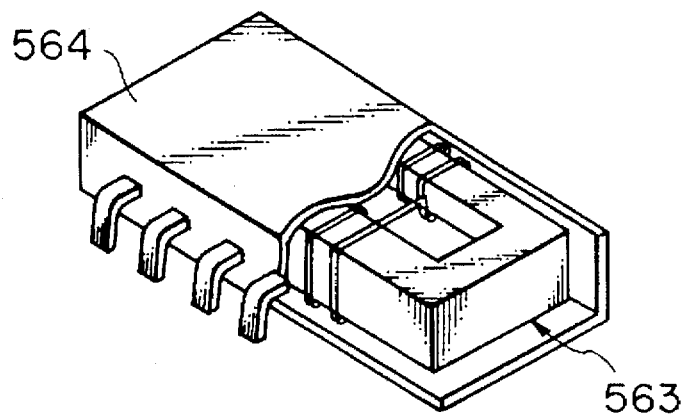
FIG. 56 shows an oblique view, with a portion broken away to reveal the EMC filter, of an eleventh example of applications of the EMC filter according to the present invention.

FIG. 56 shows an oblique view, with a portion broken away to reveal the EMC filter, of an eleventh example of applications of the EMC filter according to the present invention. In this example, an EMC filter 563 is assembled in a housing 564 of an IC or LSI chip. The EMC filter 563 itself has the same structure as the EMC filter of the fifteenth embodiment shown in FIGS. 25a and 25b.

Figure 57:
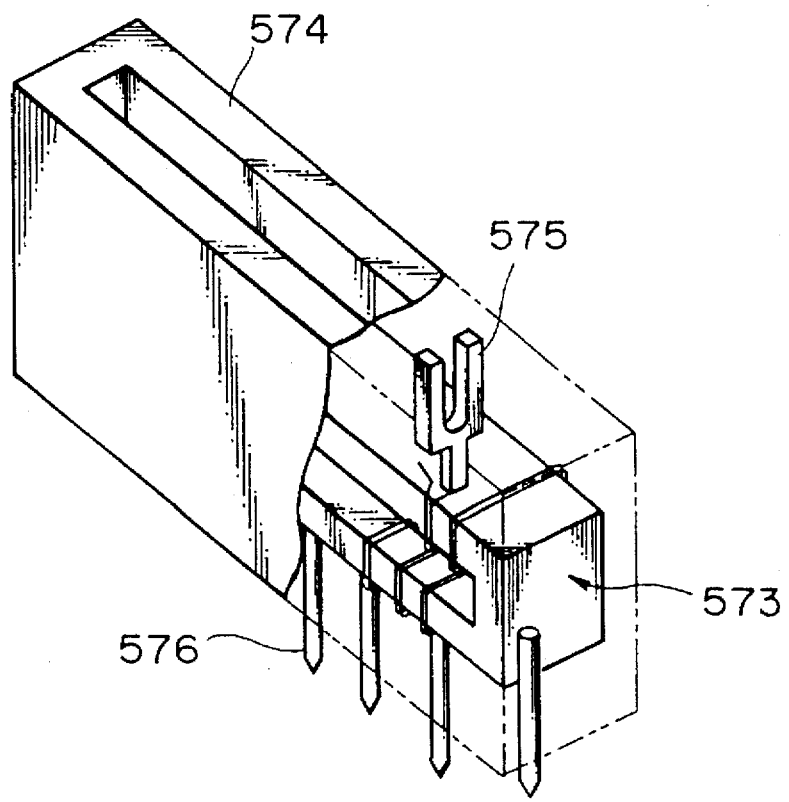
FIG. 57 shows an oblique view, with a portion broken away to reveal the EMC filter, of a twelfth example of applications of the EMC filter according to the present invention.

FIG. 57 shows an oblique view, with a portion broken away to reveal the EMC filter, of a twelfth example of applications of the EMC filter according to the present invention. In this example, an EMC filter 573 is assembled in a housing 574 of a multi-terminals connector used for a printed wiring board. In the figure, a reference numeral 575 denotes U-shaped or U-slit connection terminals for inserting the printed wiring board, and 576 denotes external connection terminals. The EMC filter 573 itself has the same structure as the EMC filter of the fifteenth embodiment shown in FIGS. 25a and 25b.

Figure 58:
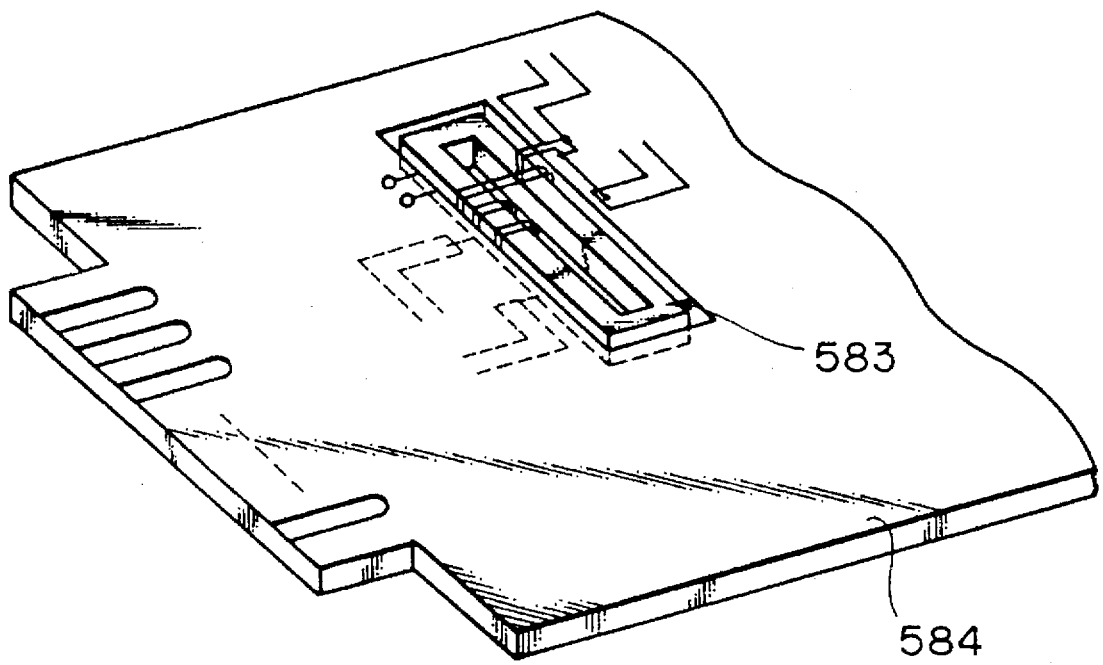
FIGS. 58a and 58b show an oblique view and a sectional view of a thirteenth example of applications of the EMC filter according to the present invention.
Figure 58:
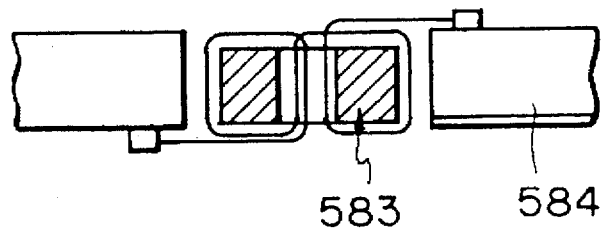

FIGS. 58a and 58b show an oblique view and a sectional view of a thirteenth example of applications of the EMC filter according to the present invention. In this example, a thin EMC filter 583 is directly mounted in a printed wiring board 584. The EMC filter 583 itself has the same structure but thin as the EMC filter of the fifteenth embodiment shown in FIGS. 25a and 25b.

Figure 59:
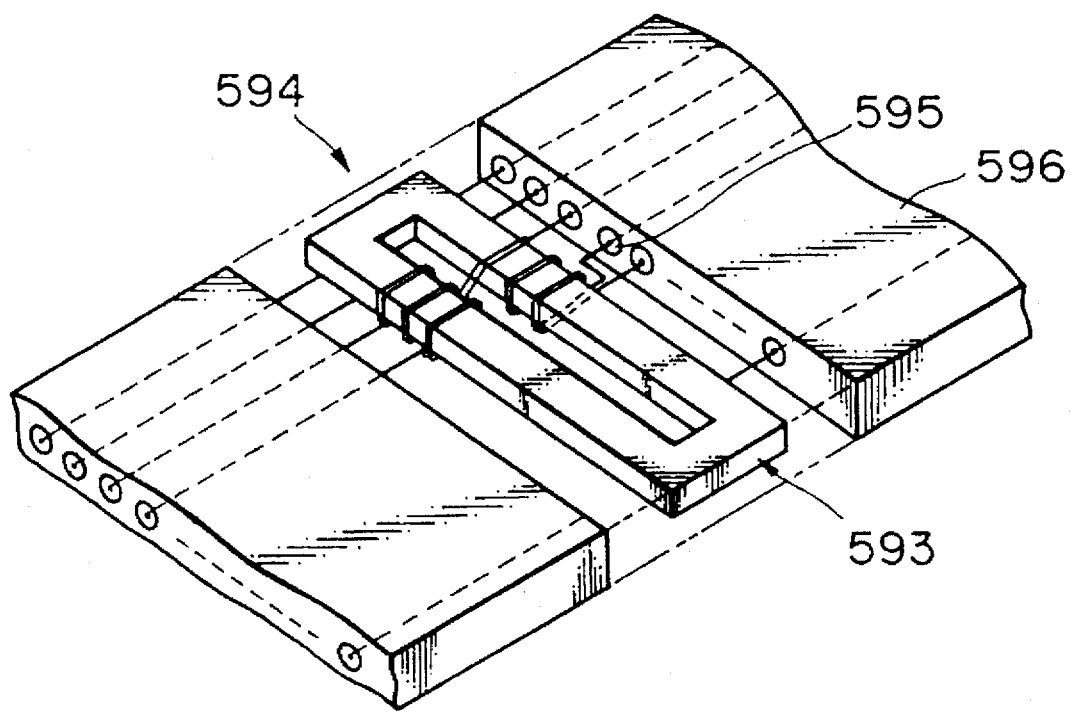
FIGS. 59a and 59b show an oblique view and a sectional view of a fourteenth example of applications of the EMC filter according to the present invention.
Figure 59:
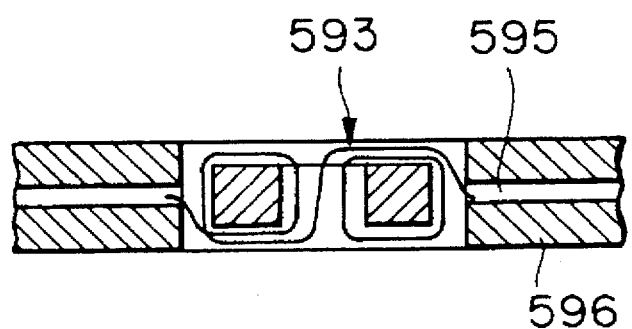

FIGS. 59a and 59b show an oblique view and a sectional view of a fourteenth example of applications of the EMC filter according to the present invention. In this example, a thin EMC filter 593 is directly mounted in a flat cable 594. Thus, common-mode noise currents flowing through the flat cable 594 can be suppressed without using any special connector for the EMC filter. In the figures, a reference numeral 595 denotes wires of the cable and 596 denotes a cable cover. The EMC filter 593 itself has the same structure but thin as the EMC filter of the fifteenth embodiment shown in FIGS. 25a and 25b.

In the aforementioned examples applications of the EMC filter according to the present invention, EMC filters of the particular embodiments are assembled in modular jacks, in a modular plug, in flat connectors, in D-type sub-connector, in IC chip, in multi-terminals connector, in a printed wiring board, and in a flat cable. However, any type of the EMC filter can be assembled in these components.

Many widely different embodiments of the present invention may be constructed without departing from the spirit and scope of the present invention. It should be understood that the present invention is not limited to the specific embodiments described in the specification, except as defined in the appended claims.

What is claimed is:

1. An EMC filter for a balanced multi-wired telecommunication line comprising:

an oblong closed magnetic path core having input side and output side first core arms with a first length and two second core arms with a second length shorter than said first length, said input side and output side first core arms and said second core arms constituting a closed magnetic path; and a plurality of coils, each of said coils being constituted by a pair of wires, said wires of each pair being closely positioned to each other and wound around said input side and output side first core arms so as to produce magnetic fluxes in these first core arms flowing toward the same direction when high frequency common-mode currents flows through the respective wires of each pair and to produce magnetic fluxes in these first core arms flowing toward the opposite directions when high frequency normal-mode currents flow through the respective wires of each pair, each of said coils having a signal input end and a signal output end, said wires running in a one-way direction from said signal Input ends to said signal output ends, respectively, wherein said plurality of signal input ends are positioned along said input side first core arm and said plurality of signal output ends are positioned along said output side first core arm, each, pair of said wires being started from said signal input end, wound around said input side first core arm along its axis toward a first axial direction, in which each pair of said wound wires is distributed with a space between its neighbor windings, traversed to said output side first core arm, wound around said output side first core arm along its axis toward a second axial direction opposite to said first axial direction, in which each pair of said wound wires is distributed with a space between its neighbor windings, and terminated at said signal output end, and wherein each of said input side and output side first core arms consists of first sections and a second section, said second section being positioned near a center of said each of input side and output side first core arms and said first sections being positioned at both sides of said second section, and wherein each pair of said wound wires is distributed with a space between its neighbor windings in said first sections, and each pair of said wound wires is concentrated with no space between its neighbor windings in said second section.

2. The EMC filter as claimed in claim 1, wherein said input side and output side first core arms are in parallel with each other and said second core arms are in parallel with each other so that said closed magnetic path core forms a rectangular shaped loop.

3. An EMC filter for a balanced multi-wired telecommunication line comprising:

an oblong closed magnetic path core having input side and output side first core arms with a first length and two second core arms with a second length shorter than said first length, said input side and output side first core arms and said second core arms constituting a closed magnetic path; and a plurality of coils, each of said coils being constituted by a pair of wires, said wires of each pair being closely positioned to each other and wound around said input side and output side first core arms so as to produce magnetic fluxes in these first core arms flowing toward the same direction when high frequency common-mode currents flows through the respective wires of each pair and to produce magnetic fluxes in these first core arms flowing toward the opposite directions when high frequency normal-mode currents flow through the respective wires of each pair, each of said coils having a signal input end and a signal output end, said wires running in a one-way direction from said signal Input ends to said signal output ends, respectively, wherein said plurality of signal input ends are positioned along said input side first core arm and said plurality of signal output ends are positioned along said output side first core arm, cach pair of said wires being started from said signal input end, wound around said input side first core arm along its axis toward a first axial direction, in which each pair of said wound wires is distributed with a space between its neighbor windings, traversed to said output side first core arm, wound around said output side first core arm along its axis toward a second axial direction opposite to said first axial direction, in which each pair of said wound wires is distributed with a space between its neighbor windings, and terminated at said signal output end, and wherein said closed magnetic path core further includes a center core arm parallel to said input side and output side first core arms to form two rectangular shaped loops, each of said wires being started from said signal input end, wound around said input side first core arm toward a first axial direction, traversed to said center core arm, wound around said center core arm, traversed to said output side first core arm, wound around said output side first core arm toward a second axial direction opposite to said first axial direction, and terminated at said signal output end.

4. An EMC filter for a balanced multi-wired telecommunication line comprising:

an oblong closed magnetic path core having input side and output side first core arms with a first length and two second core arms with a second length shorter than said first length, said input side and output side first core arms and said second core arms constituting a closed magnetic path; and a plurality of coils, each of said coils being constituted by a pair of wires, said wires of each pair being closely positioned to each other and wound around said input side and output side first core arms so as to produce magnetic fluxes in these first core arms flowing toward the same direction when high frequency common-mode currents flows through the respective wires of each pair and to produce magnetic fluxes in these first core arms flowing toward the opposite directions when high frequency normal-mode currents flow through the respective wires of each pair, each of said coils having a signal input end and a signal output end, said wires running in a one-way direction from said signal input ends to said signal output ends, respectively, wherein said plurality of signal input ends are positioned at a center of said input side first core arm and said plurality of signal output ends are positioned at a center of said output side first core arm, each pair of said wires being started from said signal input end, wound around said input side first core arm along its axis toward one end of said input side first core arm, in which each pair of said wound wires is distributed with a space between its neighbor windings, traversed to said output side first core arm, wound around said output side first core arm along its axis toward the center of said output side first core arm, in which each pair of said wound wires is distributed with a space between its neighbor windings, and terminated at said signal output end.

5. The EMC filter as claimed in claim 4, wherein each pair of said wires is constituted by parallel pair wires contacted with each other.

6. The EMC filter as claimed in claim 4, wherein each pair of said wires is constituted by twisted pair wires.

7. The EMC filter as claimed in claim 4, wherein each pair of said wound wires is distributed with a space between its neighbor windings in said input side and output side first core arms, and wherein each pair of said wound wires is concentrated with no space between its neighbor windings in said second core arms.

8. The EMC filter as claimed in claim 4, wherein each of said input side and output side first core arms consists of first sections and a second section, said second section being positioned near a center of said each of input side and output side first core arms and said first sections being positioned at both sides of said second section, and wherein each pair of said wound wires is distributed with a space between its neighbor windings in said first sections, and each pair of said wound wires is concentrated with no space between its neighbor windings in said second section.

9. The EMC filter as claimed in claim 8, wherein said input side and output side first core arms are in parallel with each other and said second core arms are in parallel with each other so that said closed magnetic path core forms a rectangular shaped loop.

10. The EMC filter as claimed in claim 8, wherein said filter further comprises an additional closed magnetic path core laid across said second sections of said input side and output side first core arms, and wherein said pair wires are wound around said additional closed magnetic path core in common with said second section of said input side first core arm or said output side first core arm.

11. The EMC filter as claimed in claim 8, wherein said closed magnetic path core forms a loop core having a generally rhombus shape.

12. The EMC filter as claimed in claim 8, wherein said closed magnetic path core forms an oval loop core.

* * * * *